US009748453B2

(12) United States Patent
Kim et al.

(10) Patent No.: US 9,748,453 B2
(45) Date of Patent: Aug. 29, 2017

(54) SEMICONDUCTOR LIGHT EMITTING DEVICE HAVING CONVEX PORTION MADE WITH DIFFERENT MATERIALS

(71) Applicant: SAMSUNG ELECTRONICS CO., LTD., Suwon-si (KR)

(72) Inventors: Jong Hak Kim, Hwaseong-si (KR); Tan Sakong, Seoul (KR); Eun Deok Sim, Yongin-si (KR); Jeong Wook Lee, Yongin-si (KR); Jin Young Lim, Gwacheon-si (KR); Byoung Kyun Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/146,372

(22) Filed: May 4, 2016

(65) Prior Publication Data

US 2016/0372643 A1    Dec. 22, 2016

(30) Foreign Application Priority Data

Jun. 22, 2015    (KR) ........................ 10-2015-0088594

(51) Int. Cl.
*H01L 33/00* (2010.01)
*H01L 33/58* (2010.01)
*H01L 33/22* (2010.01)
*H01L 33/32* (2010.01)

(52) U.S. Cl.
CPC .............. *H01L 33/58* (2013.01); *H01L 33/22* (2013.01); *H01L 33/007* (2013.01); *H01L 33/32* (2013.01); *H01L 2224/14* (2013.01); *H01L 2224/16225* (2013.01); *H01L 2224/48091* (2013.01); *H01L 2224/48247* (2013.01);

(Continued)

(58) Field of Classification Search
CPC .... H01L 33/58; H01L 33/0012; H01L 33/007
USPC .......................................................... 257/98
See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |
| 6,657,236 B1 | 12/2003 | Thibeault et al. |

(Continued)

FOREIGN PATENT DOCUMENTS

| KR | 10-2006-0110521 A | 10/2006 |
| KR | 10-1023135 B1 | 3/2011 |

(Continued)

OTHER PUBLICATIONS

Lee, Y.J. et al., "Enhancing the Output Power of GaN-Based LEDs Grown on Wet-Etched Patterned Sapphire Substrates", IEEE Photonics Technology Letters, May 15 2006, 3 pages total, Vo 18 No. 10, IEEE.

(Continued)

*Primary Examiner* — Caleb Henry
(74) *Attorney, Agent, or Firm* — Sughrue Mion, PLLC

(57) ABSTRACT

A semiconductor light emitting device includes a substrate formed of a first material; and a convex portion protruding from the substrate and including: a first layer formed of the first material as that of the substrate; and a second layer formed of a second material different from the first material and disposed on the first layer. A second height of the second layer is greater than a first height of the first layer.

19 Claims, 19 Drawing Sheets

(52) U.S. Cl.
CPC ............... *H01L 2224/48257* (2013.01); *H01L 2224/49107* (2013.01); *H01L 2924/181* (2013.01); *H01L 2933/0083* (2013.01)

(56) References Cited

U.S. PATENT DOCUMENTS

| | | | |
|---|---|---|---|
| RE38,466 E | | 3/2004 | Inoue et al. |
| 6,818,465 B2 | * | 11/2004 | Biwa ..................... H01L 33/24 |
| | | | 257/190 |
| 6,818,530 B2 | | 11/2004 | Shimoda et al. |
| 6,858,081 B2 | * | 2/2005 | Biwa ..................... C30B 25/02 |
| | | | 117/102 |
| 6,967,353 B2 | * | 11/2005 | Suzuki ................... H01L 33/24 |
| | | | 257/101 |
| 7,002,182 B2 | * | 2/2006 | Okuyama ............... H01L 33/24 |
| | | | 257/103 |
| 7,084,420 B2 | | 8/2006 | Kim et al. |
| 7,087,932 B2 | | 8/2006 | Okuyama et al. |
| 7,154,124 B2 | | 12/2006 | Han et al. |
| 7,208,725 B2 | | 4/2007 | Sherrer et al. |
| 7,288,758 B2 | | 10/2007 | Sherrer et al. |
| 7,319,044 B2 | | 1/2008 | Han et al. |
| 7,501,656 B2 | | 3/2009 | Han et al. |
| 7,709,857 B2 | | 5/2010 | Kim et al. |
| 7,759,140 B2 | | 7/2010 | Lee et al. |
| 7,781,727 B2 | | 8/2010 | Sherrer et al. |
| 7,790,482 B2 | | 9/2010 | Han et al. |
| 7,940,350 B2 | | 5/2011 | Jeong |
| 7,959,312 B2 | | 6/2011 | Yoo et al. |
| 7,964,881 B2 | | 6/2011 | Choi et al. |
| 7,985,976 B2 | | 7/2011 | Choi et al. |
| 7,994,525 B2 | | 8/2011 | Lee et al. |
| 8,008,683 B2 | | 8/2011 | Choi et al. |
| 8,013,352 B2 | | 9/2011 | Lee et al. |
| 8,049,161 B2 | | 11/2011 | Sherrer et al. |
| 8,129,711 B2 | | 3/2012 | Kang et al. |
| 8,179,938 B2 | * | 5/2012 | Kim ....................... H01L 33/24 |
| | | | 372/43.01 |
| 8,263,987 B2 | | 9/2012 | Choi et al. |
| 8,324,646 B2 | | 12/2012 | Lee et al. |
| 8,367,445 B2 | | 2/2013 | Okuno |
| 8,399,944 B2 | | 3/2013 | Kwak et al. |
| 8,432,511 B2 | | 4/2013 | Jeong |
| 8,459,832 B2 | | 6/2013 | Kim |
| 8,502,242 B2 | | 8/2013 | Kim |
| 8,536,604 B2 | | 9/2013 | Kwak et al. |
| 8,735,931 B2 | | 5/2014 | Han et al. |
| 8,766,295 B2 | | 7/2014 | Kim |
| 2006/0204865 A1 | * | 9/2006 | Erchak ................... H01L 33/20 |
| | | | 430/7 |
| 2009/0057700 A1 | * | 3/2009 | Jin ......................... H01L 33/20 |
| | | | 257/98 |
| 2012/0025246 A1 | | 2/2012 | Kim et al. |
| 2014/0124805 A1 | | 5/2014 | Minato et al. |
| 2014/0191243 A1 | * | 7/2014 | Singh .................... H01L 33/007 |
| | | | 257/76 |
| 2015/0048385 A1 | | 2/2015 | Yu et al. |
| 2015/0064821 A1 | | 3/2015 | Cha et al. |

FOREIGN PATENT DOCUMENTS

| | | |
|---|---|---|
| KR | 10-2012-0128961 A | 11/2012 |
| KR | 10-2013-0015770 A | 2/2013 |
| KR | 10-2013-0046402 A | 5/2013 |
| KR | 10-2014-0071161 A | 6/2014 |

OTHER PUBLICATIONS

Chang, S.J. et al, "Nitride-based LEDs fabricated on patterned sapphire substrates", Solid-State Electronics 47, 2003, 4 pages total, Elsevier Science Ltd.

Park et al., "Air-voids embedded high efficiency InGaN-light emitting diode", Applied Physics Letters 93, 2008, 4 pages total, 191103, American Institute of Physics.

Crunteanu, A. et al., "Three-dimensional structuring of sapphire by sequential He+ ion-beam implantation and wet chemical etching", Applied Physics A 76, 2003, 1109-1112.

Feng, L. et al., "Rain Erosion Behavior of Silicon Dioxide Films Prepared on Sapphire", J. Mater. Sci. Technol., 2005, 4 pages total, Vo 21 No. 6.

* cited by examiner

SEMICONDUCTOR LIGHT EMITTING DEVICE HAVING CONVEX PORTION MADE WITH DIFFERENT MATERIALS

CROSS-REFERENCE TO RELATED APPLICATION

This application claims priority from Korean Patent Application No. 10-2015-0088594 filed on Jun. 22, 2015, with the Korean Intellectual Property Office, the disclosure of which is incorporated herein by reference in its entirety.

BACKGROUND

Apparatuses consistent with example embodiments relate to a semiconductor light emitting device.

A light emitting diode (LED) is a device including a material emitting light when electrical energy is applied thereto, in which energy generated through electron-hole recombination in semiconductor junction parts is converted into light to be emitted therefrom. LEDs are commonly employed as light sources in lighting devices and backlight units of large liquid crystal displays (LCDs), and thus, development of LEDs has been accelerated.

Recently, a utilization range of LEDs has extended to light sources of high current/high output fields. Thus, a structure of a light emitting device having improved light extraction efficiency is required in the art.

SUMMARY

One or more example embodiments may provide a semiconductor light emitting device having enhanced light extraction efficiency.

According to an example embodiment, a semiconductor light emitting device may include: a substrate formed of a first material; and a convex portion protruding from the substrate and including: a first layer formed of the first material as that of the substrate; and a second layer formed of a second material different from the first material and disposed on the first layer, wherein a second height of the second layer is greater than a first height of the first layer.

The first height and the second height may be measured in a thickness direction of the semiconductor light emitting device.

A ratio of the first height to a height of the convex portion including the first and the second layers ranges from 0.1 to 0.4.

The height of the first layer may range from 240 nm to 380 nm.

The second material may correspond to a material having a refractive index smaller than that of the substrate.

The second layer may include a plurality of materials, each of the plurality of materials having a refractive index smaller than that of the substrate.

A refractive index of the second layer may range from 1 to 1.7.

The second layer may be formed of $SiO_x$, $SiO_xN_y$, or $MgF_2$.

The second layer may have a hemispherical or conic shape.

The convex portion may include a plurality of protrusions, and the plurality of protrusions may be arranged in a lattice form.

In a vertical cross-sectional view, the first layer may have a side surface extending from a lower surface of the second layer, the side surface of the first layer being inclined at a first angle with respect to an upper surface of the substrate and a side surface of a lower portion of the second layer being inclined at a second angle with respect to the upper surface of a substrate, and the first angle may be different from the second angle.

The first angle may be the same as the second angle.

The substrate surrounding the convex portion may include a flat surface.

The substrate surrounding the convex portion may include an uneven surface.

According to an example embodiment, a semiconductor light emitting device may include: a substrate made of a first material; a convex portion disposed on a first surface of the substrate and including: a first layer made of the first material; and a second layer made of a second material different from the first material and disposed on the first layer; and a light emitting stack including: a first conductivity-type semiconductor layer; an active layer; and a second conductivity-type semiconductor layer, the first conductivity-type semiconductor layer, the active layer and the second conductivity-type semiconductor layer sequentially disposed on the first surface of the substrate on which the convex portion is disposed, a height of the first layer may range from 240 nm to 380 nm.

The height of the first layer may be measured in a thickness direction of the semiconductor light emitting device.

A height of the second layer may be 1.5 to 9 times the height of the first layer.

The substrate may include a sapphire substrate, and the light emitting stack may be formed of a Group III nitride semiconductor.

BRIEF DESCRIPTION OF DRAWINGS

The above and/or other aspects, features, and advantages of the disclosure will be more clearly understood from the following detailed description taken in conjunction with the accompanying drawings, in which.

DETAILED DESCRIPTION

Figure 1:
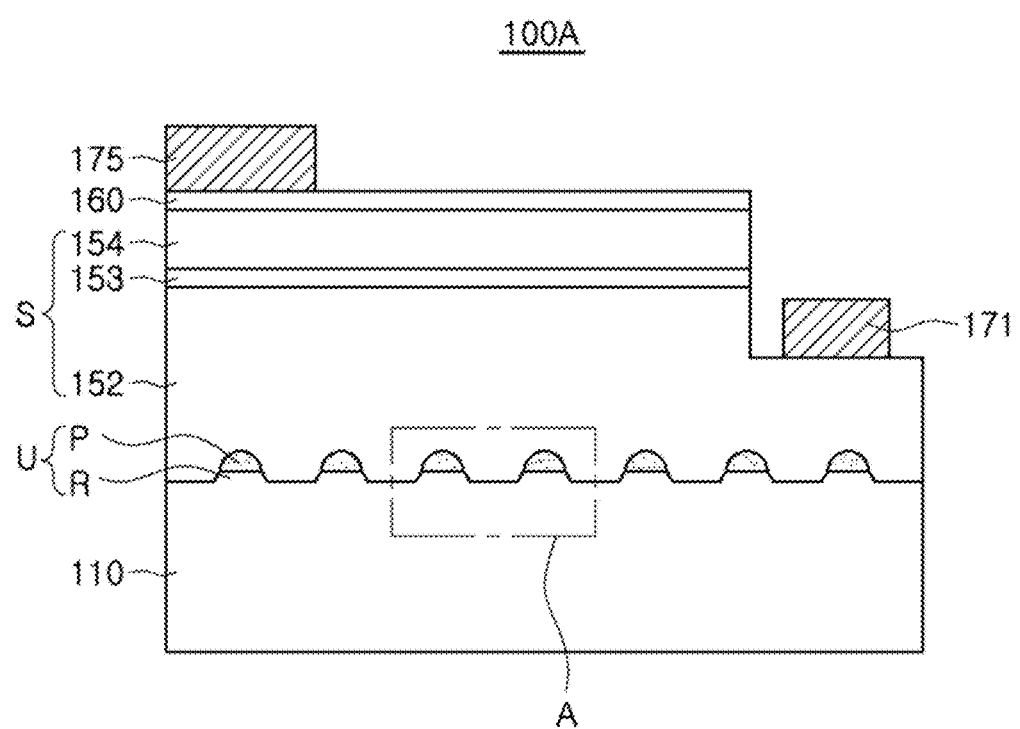
FIG. 1 is a cross-sectional view illustrating a semiconductor light emitting device according to an example embodiment in the present disclosure.

Hereinafter, example embodiments of the disclosure will be described in detail with reference to the accompanying drawings. Example embodiments of the disclosure are provided for fully conveying the inventive concept to those of ordinary skill in the art. The inventive concept may be embodied in many different forms and should not be construed as being limited to the embodiments set forth herein; rather, these embodiments are provided so that this disclosure will be thorough and complete, and will fully convey the inventive concept to those of ordinary skill in the art. Also, a thickness or a size of each layer in the drawings may be exaggerated for convenience of description and clarity of the specification.

Throughout the specification, it will be understood that when an element such as a film, a region, or a wafer (substrate) is referred to as being positioned to be "on" or "connected to" another element, it can be on, connected, or coupled to the other element, or intervening elements may be present. However, when an element is referred to as being positioned to be "directly on" or "directly connected to", or "directly coupled to" another element, it will be understood that intervening elements are not present. The same reference numerals will be used throughout to designate the same or like elements. As used herein, the term and/or includes any and all combinations of one or more of the associated listed items.

Also, though terms like a first and a second are used to describe various members, components, regions, layers, and/or portions in various example embodiments, the members, components, regions, layers, and/or portions are not limited to these terms. These terms are used only to differentiate one member, component, region, layer, or portion from others thereof. Therefore, a member, a component, a region, a layer, or a portion referred to as a first member, a first component, a first region, a first layer, or a first portion in an embodiment may be referred to as a second member, a second component, a second region, a second layer, or a second portion in another example embodiment.

Also, relative terms such as "on", "upper", "under", or "below" may be used to describe relationships of certain elements to other elements as depicted in the drawings. Relative terms may be understood as intending the inclusion of other directions of a device in addition to directions illustrated in the drawings. For example, when a device is turned over in the drawings, elements illustrated to be present on surfaces of other elements may be oriented under the foregoing other elements. Thus, for example, the term "on" may include both directions of "under" and "on" relying on a particular direction of drawings. When an element is oriented in a different direction (rotated by 90 degrees with respect to the different direction), relative descriptions used in this disclosure may be interpreted accordingly.

The technical terms used in this disclosure are only used for explaining a specific example embodiment while not limiting the inventive concept. The terms of a singular form may include plural forms unless referred to the contrary. Also, it will be further understood that the terms "comprise" and/or "comprising," when used herein, specify the presence of stated features, integers, steps, operations, elements, and/or components, but do not preclude the presence or addition of one or more other features, steps, operations, elements, components, and/or groups thereof.

Hereinafter, ideal example embodiments of the inventive concept will be described with reference to the accompanying drawings. In the accompanying drawings, for example, modifications of an illustrated shape may be expected according to manufacturing technology and/or tolerance. Therefore, example embodiments should not be construed as being limited to a specific shape of a region illustrated in the drawing, and for example, should include a shape change caused in a manufacturing process. Hereinafter, one or a plurality of example embodiments may be combined to be configured.

A semiconductor light emitting device described hereinafter may have various components, and here, only required components will be illustrated, and the contents of the present inventive concept is not limited thereto.

FIG. 1 is a cross-sectional view illustrating a semiconductor light emitting device according to an example embodiment. Referring to FIG. 1, a semiconductor light emitting device 100A according to an example embodiment may include a substrate 110, a convex portion U (i.e., a protrusion), and a light emitting stack S. The semiconductor light emitting device 100A may include a transparent electrode layer 160, a first electrode 171, and a second electrode 175.

The substrate 110 may be sapphire, Si, $MgAl_2O_4$, MgO, $LiAlO_2$, $LiGaO_2$, or GaN. Each of convex portions U (i.e., a plurality of protrusions) including a first layer R formed of the same material as that of the substrate 110 and a second layer P formed of a material different from that of the substrate 110 may be provided on one surface of the substrate 110.

The first layer R may be formed by removing a portion of the substrate 110. The first layer R may be formed by an etching process to remove byproducts remaining on the substrate 110 during a process of forming the second layer P. Convex portions U formed on one surface of the substrate 110 may enhance quality of a semiconductor layer grown on the substrate 110, while improving light extraction efficiency.

The convex portions U will be described with reference to FIGS. 2A through 3B.

Figure 2A:
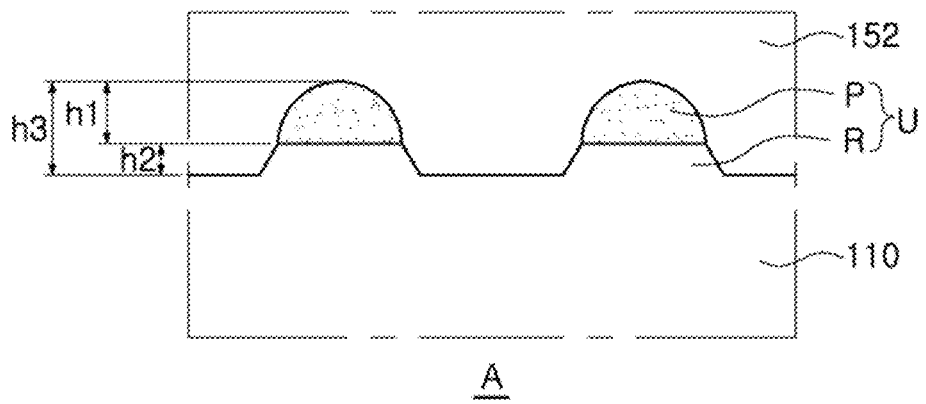
FIGS. 2A and 2B are cross-sectional views illustrating convex portions according to an example embodiment.
Figure 2B:
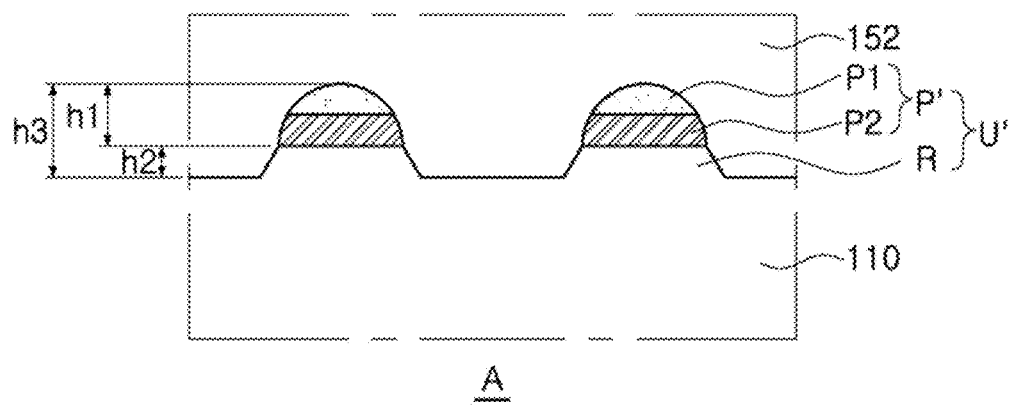

FIGS. 2A and 2B are cross-sectional views illustrating convex portions U according to an example embodiment, in which portions corresponding to a region "A" of FIG. 1 are enlarged.

Referring to FIG. 2A, the convex portion U may include a first layer R and a second layer P disposed on the first layer R. A overall height h3 of the convex portion U from a surface of the substrate 110 may be defined by the sum of a height h1 of the second layer P from an upper surface of the first layer R to an upper end of the second layer P (hereinafter referred to as a height h1 of the second layer P) and a height h2 from a surface of the substrate 110 to an upper surface of the first layer R (hereinafter referred to as a height h2 of the first layer R). The height h2 of the first layer R may be understood as a depth of an etched substrate 110.

The height h1 of the second layer P may be higher than the height h2 of the first layer R. A ratio (h2/h3) of the height h2 of the first layer R to the overall height h3 of the convex portion U may be 0.1 to 0.4. In other words, the height h1 of the second layer P may be 1.5 times to 9 times the height h2 of the first layer R. The height h2 of the first layer R may range from 240 nm to 380 nm. The ranges of the numerical values will be described hereinafter with reference to FIGS. 8 and 9.

In the example embodiment, the second layer P may have a single layer structure formed of a single material having a refractive index different from that of the substrate 110. The refractive index of the second layer P may be smaller than that of the substrate 110, and may range from 1.0 to 1.7. For example, the second layer P may be formed of $SiO_x$, $SiO_xN_y$, or $MgF_2$. The range of the numerical values will be described hereinafter with reference to FIG. 7.

The second layer P may have a hemispherical or conic shape. The first layer R may have a side surface extending from a lower portion of the second layer P and sloped with respect to the surface of the substrate 110. Alternatively, in an example embodiment, the first layer R may have a side surface extending from a lower portion of the second layer P and perpendicular with respect to the surface of the substrate 110.

The substrate 110 around the convex portions U may have a flat surface. Alternatively, in an example embodiment, the substrate 110 around the convex portions U may have a curved surface.

Referring to FIG. 2B, in an example embodiment, a second layer P' may have a multilayer structure in which a plurality of materials having different refractive indices different from that of the substrate 110 are stacked. A refractive index of the second layer P' may have a refractive index smaller than that of the substrate 110, and may range from 1.0 to 1.7. In the example embodiment, the second layer P' including a first material part P1 having a refractive index different from that of the substrate 110 and a second material part P2 having a refractive index different from that of the first material part P1 is illustrated.

Figure 3A:
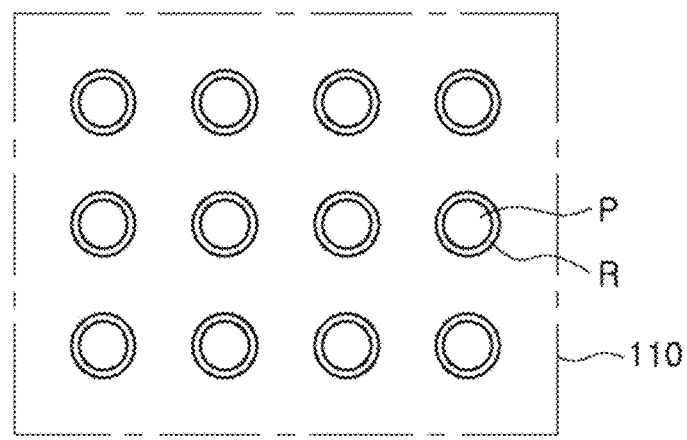
FIGS. 3A and 3B are plan views illustrating arrays of convex portions according to an example embodiment.
Figure 3B:
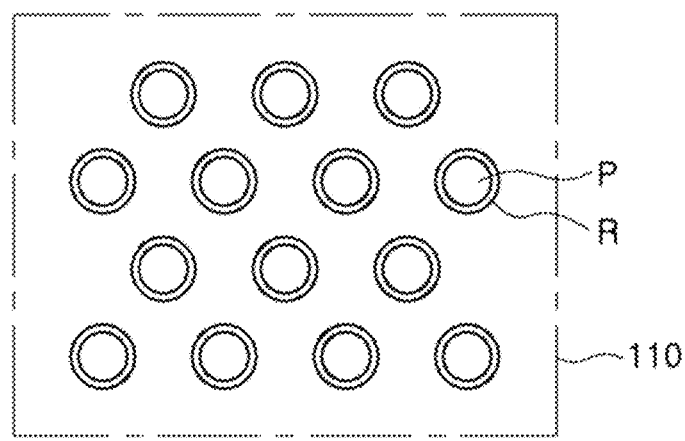

FIGS. 3A and 3B are plan views illustrating arrays of convex portions U according to an example embodiment.

Referring to FIG. 3A, the convex portions U may be regularly and repeatedly arranged in a square lattice form so that the convex portions U are disposed at the vertices of a quadrangle. Alternatively, referring to FIG. 3B, three adjacent convex portions U may be regularly and repeatedly arranged in a hexagonal lattice form in which the convex portions U are disposed at vertices of a triangle. However, the arrangement of the convex portions U is not limited thereto, and the convex portions U may be arranged in variously modified forms.

Referring back to FIG. 1, a light emitting stack S may include a first conductivity-type semiconductor layer 152, an active layer 153, and a second conductivity-type semiconductor layer 154 sequentially disposed on the substrate 110. A first electrode 171 may be formed on the first conductivity-type semiconductor layer 152 exposed as the second conductivity-type semiconductor layer 154 and the active layer 153 are etched, and a transparent electrode layer 160 and a second electrode 175 may be sequentially formed on the second conductivity-type semiconductor layer 154.

A buffer layer (not shown) may be provided between the substrate 110 and the first conductivity-type semiconductor layer 152. The buffer layer may be formed of $In_xAl_yGa_{1-x-y}N$, where $0 \le x \le 1$ and $0 \le y \le 1$. For example, the buffer layer may be formed at low temperatures of 500° C. to 600° C., and may be purposefully formed of GaN, AlN, AlGaN, or InGaN undoped. The buffer layer may be used by combining a plurality of layers or by gradually changing a composition as necessary.

The first conductivity-type semiconductor layer 152 may be a nitride semiconductor satisfying n-type $In_xAl_yGa_{1-x-y}N$, where $0 \le x < 1$, $0 \le y < 1$, and $0 \le x+y < 1$, and an n-type impurity may be silicon (Si). The second conductivity-type semiconductor layer 154 may be a nitride semiconductor layer satisfying p-type $In_xAl_yGa_{1-x-y}N$, where $0 \le x < 1$, $0 \le y < 1$, and $0 \le x+y < 1$, and a p-type impurity may be magnesium (Mg). The active layer 153 may have a multiple quantum well (MQW) structure in which quantum well layers and quantum barrier layers are alternately stacked. For example, the quantum well layers and the quantum barrier layers may be formed of $In_xAl_yGa_{1-x-y}N$, where $0 \le x \le 1$, $0 \le y \le 1$, and $0 \le x+y \le 1$, having different compositions. In a specific example, the quantum well layers may be formed of $In_xGa_{1-x}N$, where $0 < x \le 1$, and the quantum barrier layers may be formed of GAN or AlGaN.

The semiconductor light emitting device 100A illustrated in FIG. 1 may further include the transparent electrode layer 160 on the second conductivity-type semiconductor layer 154. In the example embodiment, the transparent electrode layer 160 may be selectively employed. The transparent electrode layer 160 may realize ohmic contact with the second conductivity-type semiconductor layer 154 and allow light emitted from the light emitting stack S to be transmitted therethrough. An ohmic contact material realizing ohmic contact with the second conductivity-type semiconductor layer 154 may include at least one of silver (Ag), nickel (Ni), aluminum (Al), rhodium (Rh), palladium (Pd), iridium (Ir), ruthenium (Ru), magnesium (Mg), zinc (Zn), platinum (Pt), and gold (Au), and may be a single layer or may have a structure including a plurality of layers. Also, the transparent electrode layer 160 may be any one of a transparent conductive oxide layer or nitride layer, and may be at least one selected from the group consisting of indium tin oxide (no), zinc-doped indium tin oxide (ZITO), zinc indium oxide (ZIO), gallium indium oxice (GIO), zinc tin oxide (ZTO), fluorine-doped tin oxide (FTO), aluminum-doped zinc oxide (AZO), gallium-doped zinc oxide (GZO), and $In_4Sn_3O_{12}$, and $Zn_{(1-x)}MgO_xX$ (Zinc Magnesium Oxide, where $0 \leq x \leq 1$). If necessary, the transparent electrode layer 160 may include graphene.

For example, the first electrode 171 may include a material such as silver (Ag), nickel (Ni), aluminum (Al), chromium (Cr), rhodium (Rh), palladium (Pd), iridium (Ir), ruthenium (Ru), magnesium (Mg), zinc (Zn), platinum (Pt), and gold (Au). The first electrode 171 may be a single layer or may have a structure including two or more layers. The second electrode 171 may include at least one of aluminum (Al), gold (Au), chromium (Cr), nickel (NI), titanium (Ti), and tin (Sn).

Figure 4:
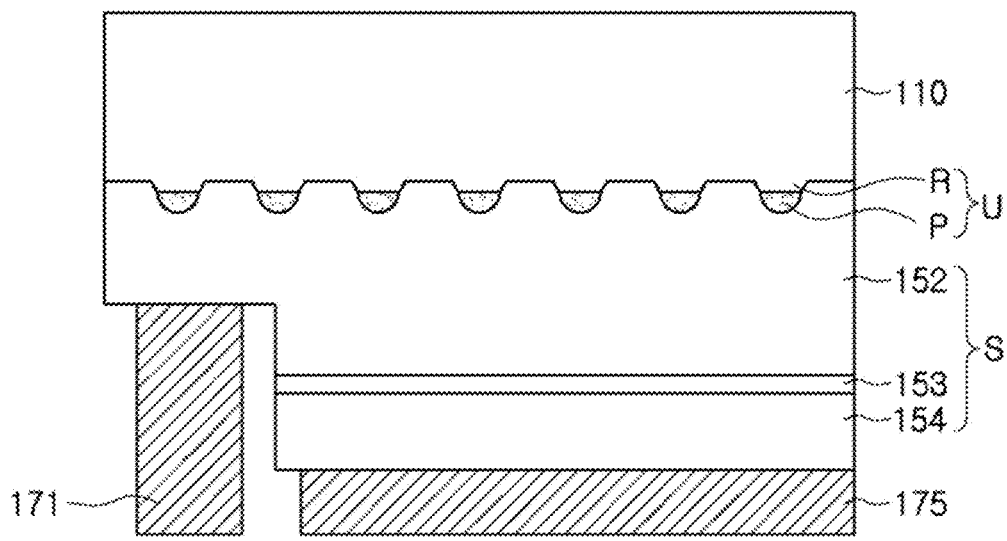
FIG. 4 is a cross-sectional view schematically illustrating a semiconductor light emitting device according to an example embodiment.

FIG. 4 is a cross-sectional view schematically illustrating a semiconductor light emitting device 100B according to an example embodiment.

A semiconductor light emitting device 100B illustrated in FIG. 4 may be applied in a flip-chip manner and may include a substrate 110, a convex portion U, and a light emitting stack S. The semiconductor light emitting device 100B may include a first electrode 171 and a second electrode 175.

In the example embodiment, the substrate 110 may provide a main light extraction surface. The substrate 110 may be an insulating substrate such as sapphire having light transmissivity. However, types of the substrate 110 are not limited thereto, and the substrate 110 may be a conductive or semiconductor substrate guaranteeing light transmissivity, in addition to the insulating substrate. The convex portion U may be formed on one surface of the substrate 110. The convex portion U may enhance quality of a single crystal semiconductor layer grown on the substrate 110, while improving light extraction efficiency. The convex portion U may be formed of the same material and have the same structure as that of the convex portion U described above with reference to FIGS. 1 through 3B.

The light emitting stack S may include a first conductivity-type semiconductor layer 152, an active layer 153, and a second conductivity-type semiconductor layer 154. A buffer layer may be provided between the substrate 110 and the first conductivity-type semiconductor layer 152.

A first electrode 171 may include a material such as Ag, Ni, Al, Cr, Rh, Pd, Ir, Ru, Mg, Zn, Pt, or Au, and may be a single layer or may have a structure including two or more layers.

A second electrode 175 may have a reflective electrode structure. The second electrode 175 may include a material such as Ag, Ni, Al, Rh, Pd, Ir, Ru, Mg, Zn, Pt, Au, and Sn, and may have a structure including two or more layers such as Ni/Ag, Zn/Ag, Ni/Al, Zn/Al, Pd/Ag, Pd/Al, Ir/Ag. Ir/Au, Pt/Ag, Pt/Al, and Ni/Ag/Pt.

Figure 5:
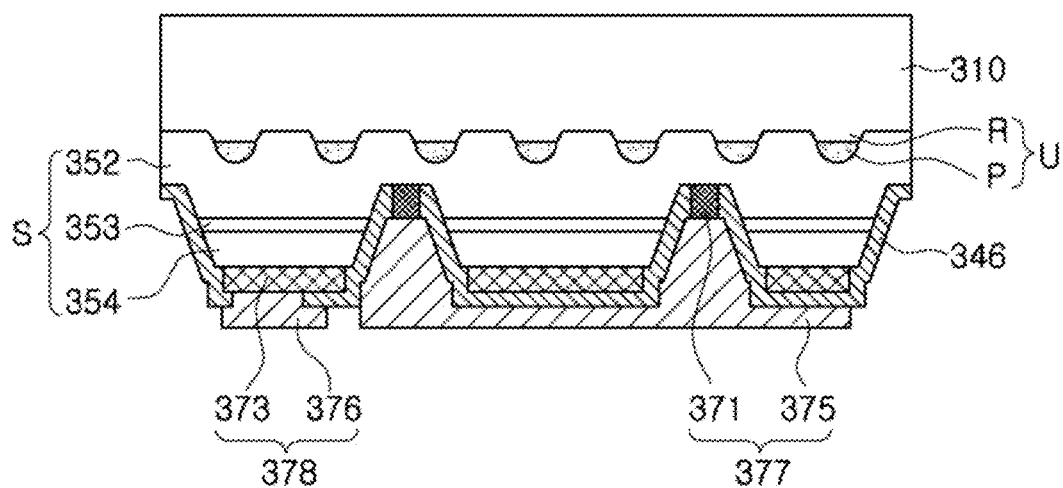
FIG. 5 is a cross-sectional view schematically illustrating a semiconductor light emitting device according to an example embodiment.

FIG. 5 is a cross-sectional view schematically illustrating a semiconductor light emitting device 300 according to an example embodiment.

Referring to FIG. 5, a semiconductor light emitting device 300 according to the example embodiment may include a light-transmissive substrate 310 and a light emitting stack S in which a first conductivity-type semiconductor layer 352, an active layer 353, and a second conductivity-type semiconductor layer 354 are sequentially stacked. Also, the semiconductor light emitting device 300 may further include a first electrode 377 connected to the first conductivity-type semiconductor layer 352 and a second electrode 378 connected to the second conductivity-type semiconductor layer 354.

The light-transmissive substrate 310 may provide a main light extracting surface. The light-transmissive substrate 310 may be an insulating substrate such as sapphire. However, a material of the light-transmissive substrate 310 is not limited thereto, and the light-transmissive substrate 310 may be a conductive or semiconductor substrate guaranteeing light transmissivity. A convex portion U may be formed on the light-transmissive substrate 310. The convex portion U may improve light extraction efficiency and enhance crystal quality of the grown light emitting stack S. The convex portion U may be formed of the same material as that of the convex portion U described above, and may have the same structure as that of the convex portion U described above.

The light emitting stack S may be formed of a Group III nitride semiconductor. The first conductivity-type semiconductor layer 352 may be a nitride semiconductor satisfying n-type $Al_xIn_yGa_{1-x-y}N$, where $0 \leq x < 1$, $0 \leq y < 1$, and $0 \leq x+y < 1$, and an n-type impurity may be silicon (Si). For example, the first conductivity-type semiconductor layer 352 may be n-type GaN. The active layer 353 may emit light having a predetermined wavelength according to electron-hole recombination, and may have a multiple quantum well (MQW) structure in which quantum well layers and quantum barrier layers are alternately stacked. For example, the active layer 353 may have a GaN/InGaN structure. Also, the active layer 353 may have a single quantum well (SQW) structure. The second conductivity-type semiconductor layer 354 may be a nitride semiconductor layer satisfying a p-type $Al_xIn_yGa_{1-x-y}N$, where $0 \leq x < 1$, $0 \leq y < 1$, and $0 \leq x+y < 1$. A p-type impurity may be magnesium (Mg). For example, the second conductivity-type semiconductor layer 354 may be a p-type GaN.

In order to reduce electronic overflowing to the second conductivity-type semiconductor layer 354, an electron blocking layer (not shown) may be provided between the active layer 353 and the second conductivity-type semiconductor layer 354. The electron blocking layer may have an energy band gap greater than that of a final quantum barrier layer of the active layer 303. For example, the electron blocking layer may be formed of $Al_rGa_{1-r}N$, where $0 < r \leq 1$.

The first electrode 377 is connected to the first conductivity-type semiconductor layer 352 through the second conductivity-type semiconductor layer 354 and the active layer 353, and may have at least one first contact region provided through at least one hole exposing a portion of the first conductivity-type semiconductor layer 352 through the second conductivity-type semiconductor layer 354 and the active layer 353. The first contact region refers to a region in which the first conductivity-type semiconductor layer 352 and the first contact electrode 371 are in contact with each other. The first electrode 377 may include a first contact electrode 371 disposed in the first contact region and a first pad electrode 375 connected to the first contact electrode 371. A plurality of first contact electrodes 371 may be disposed to lower contact resistance with respect to the first conductivity-type semiconductor layer 352 and disperse current of the light emitting device. The number of the first contact electrodes 371 is not limited to that illustrated in FIG. 5. The second electrode 378 may include a second contact electrode 373 disposed in a second contact region of the second conductivity-type semiconductor layer 354 and a second pad electrode 376 connected to the second contact electrode 373. The second contact region refers to a region in which the second conductivity-type semiconductor layer 354 and the second contact electrode 373 are in contact with each other.

The first contact electrode 371 may include a material forming ohmic contact with the first conductivity-type semiconductor layer 352. The first contact electrode 372 may include material such as Ag, Ni, Al, Rh, Pd, Ir, Ru, Mg, Zn, Pt, and Au, but the material of the first contact electrode 371 is not limited thereto, and the first contact electrode 371 may be formed as a single layer or may have a structure including a plurality of layers. For example, the first contact electrode 371 may include Cr/Au or Cr/Au/Pt. If necessary, a barrier layer may be additionally formed on the first contact electrode 371. The second contact electrode 373 may include a material forming ohmic contact with the second conductivity-type semiconductor layer 354. For example, the second contact electrode 373 may include Ag or Ag/Ni. If necessary, a barrier layer may be additionally formed on the second contact electrode 373. The barrier layer may be at least one selected from the group consisting of Ni, Al, Cu, Cr, Ti, and combinations thereof. The first and second pad electrodes 375 and 376 may include a material such as Ag, Ni, Al, Rh, Pd, Ir, Ru, Mg, Zn, Pt, and Au, and may be formed as a single layer or may have a multilayer structure.

The first electrode 377 and the second electrode 378 may be electrically separated by a passivation layer 346. The passivation layer 346 may be formed of $SiO_x$, $SiN_x$, or $SiO_xN_y$.

FIGS. 6A through 6E are views illustrating a method of manufacturing a semiconductor light emitting device according to an example embodiment.

Figure 6A:
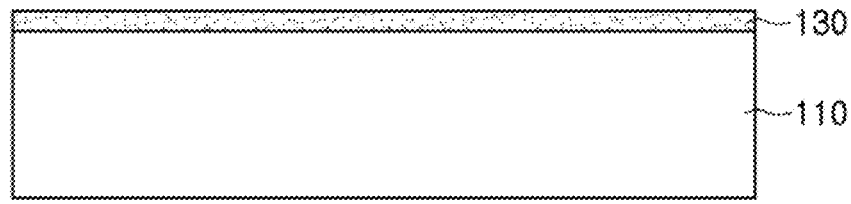
FIGS. 6A through 6E are views illustrating a method of manufacturing a semiconductor light emitting device according to an example embodiment.

First, as illustrated in FIG. 6A, a material layer 130 formed of a material different from that of a substrate 110 is formed on the substrate 110. The substrate 110 may be a substrate formed of a material such as sapphire, SiC, $MgAl_2O_4$, MgO, $LiAlO_2$, $LiGaO_2$, or GaN described above. The material layer 130 formed on the substrate 110 may be formed of a material having a refractive index different from that of the substrate 110. The material layer 130 may be formed of a material having a refractive index smaller than that of the substrate 110. In the example embodiment, the substrate 110 may be a sapphire substrate, and the material layer 130 may be formed of a material having a refractive index ranging from 1.0 to 1.7. For example, the material layer 130 may include a material such as $SiO_x$, $SiO_xN_y$, or $MgF_2$. The material layer 130 may be formed of a single material or may have a multilayer structure in which a plurality of materials are stacked.

Figure 6B:
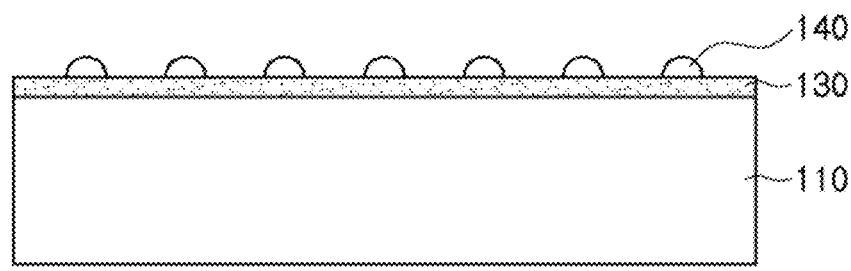

Next, as illustrated in FIG. 6B, a photoresist pattern 140 may be formed on the material layer 130.

In detail, a photoresist film is coated on the material layer 130 and subsequently exposed and developed to form the photoresist pattern 140. In order to form the photoresist pattern 140, a reflow process may be additionally performed at a predetermined temperature.

Figure 6C:

Thereafter, as illustrated in FIG. 6C, in a state in which the photoresist pattern 140 is formed, the material layer 130 is dry-etched using the photoresist pattern 140 as an etch mask to form a second layer P having a convex shape first in a region corresponding to the photoresist pattern 140. The second layer P is illustrated as having a hemispherical shape, but the shape of the second layer P is not limited thereto. In an example embodiment, the second layer P may have a conic shape. In order to etch the material layer 130, an etchant gas such as a fluorine group such as $CF_4$ or $SF_6$, a chlorine group such as $Cl_2$ or $BCl_3$, or argon (Ar) or nitrogen ($N_2$) may be used, but the etchant gas is not limited thereto, and various other etchant gases may also be applied.

While the material layer 130 formed of a material different from that of the substrate 110 is being dry-etched, a etch byproduct of the material layer 130 may penetrate into the substrate 110 or may be stably bonded with the substrate 110. The etch byproduct may not be removed through a cleaning process and may hinder nucleation in a process to grow a semiconductor layer from the substrate 110. Thus, the etch byproduct is required to be removed from the substrate 110.

Thereafter, a portion of the substrate 110 around the second layer P is etched to form a first layer R. Thus, the etch byproduct may be removed from the substrate 110 and a convex portion U including the first layer R formed of the same material as that of the substrate 110 and the second layer P formed of a material different from that of the substrate 110 and formed on the first layer R may be formed. The first layer R may be formed to have a side surface extending from a lower portion of the second layer P and sloped with respect to the lower surface of the second layer P. That is, the side surface of the first layer may be inclined at a first angle with respect to an upper surface of the substrate. A side surface of a lower portion of the second layer may be inclined at second angle with respect to the upper surface of a substrate. The first angle may be the same as the second angle. In an example embodiment, the first angle may be different from the second angle. Alternatively, in an example embodiment, the first layer R may have a side surface extending from the lower portion of the second layer P and perpendicular to a lower surface of the second layer P. That is, the side surface of the first layer may be perpendicular to an upper surface of the substrate. The substrate 110 around the convex portion U may have a flat surface. Alternatively, in an example embodiment, the substrate 110 around the convex portion U may have an uneven surface. In order to form the first layer R by etching a portion of the substrate 110, an etchant gas such as argon (Ar), or the like, may be applied, and here, a chlorine-based etchant gas such as $Cl_2$ or $BCl_3$ may be mixed with the argon (Ar) gas.

The second layer P and the first layer R may be continuously etched, and the process may be simplified by applying dry etching using the same etchant gas.

Figure 6D:
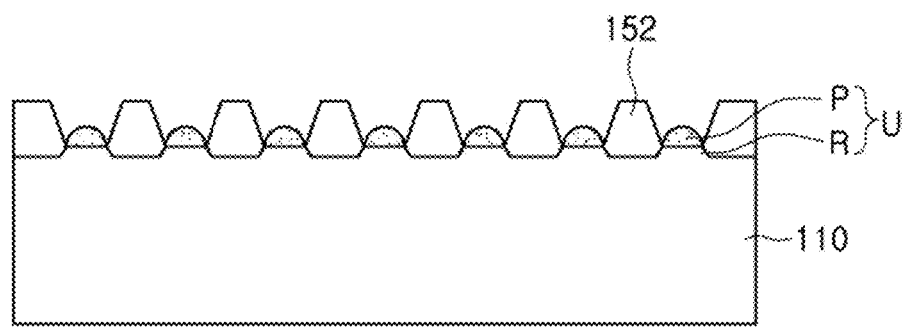

Thereafter, referring to FIG. 6D, a first conductivity-type semiconductor layer 152 may be grown on the substrate 110 with the convex portion U formed thereon. The first conductivity-type semiconductor layer 152 may be nucleated and grown from the first layer R of the substrate 110. Thereafter, the separated first conductivity-type semiconductor layer 152 may be grown laterally through an epitaxial lateral overgrowth (ELO) to form a single layer.

Here, because the first conductivity-type semiconductor layer 152 is grown laterally, dislocation generated due to a difference in lattice constant between the substrate 110 and the first conductivity-type semiconductor layer 152 is curved laterally according to the lateral growth of the first conductivity-type semiconductor layer 152, rather than propagating upwardly. Thus, dislocation density may be greatly lowered in the grown first conductivity-type semiconductor layer 152, and a high-quality nitride semiconductor light emitting device may be manufactured.

Figure 6E:
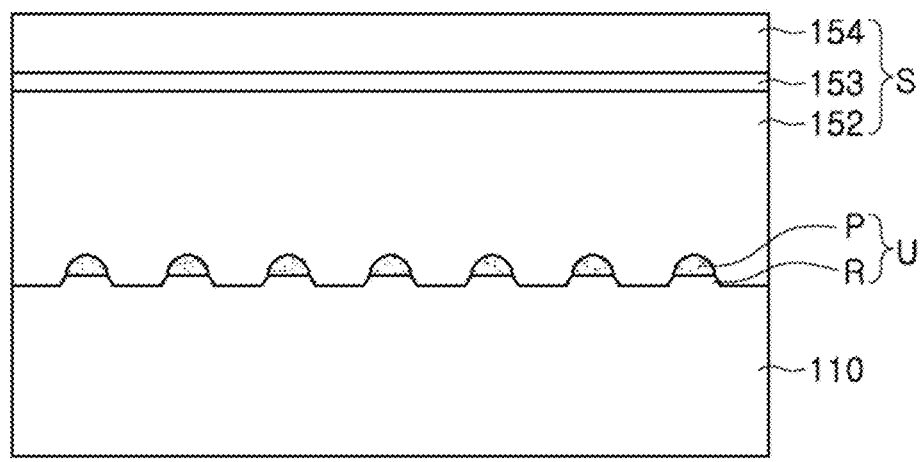

Referring to FIG. 6E, an active layer 153 and a second conductivity-type semiconductor layer 154 are sequentially stacked on the laterally grown first conductivity-type semiconductor layer 152 to form a light emitting stack S.

Thereafter, an operation of forming a first electrode connected to the first conductivity-type semiconductor layer 152 and an operation of forming a second electrode connected to the second conductivity-type semiconductor layer 154 may be performed.

Figure 7:
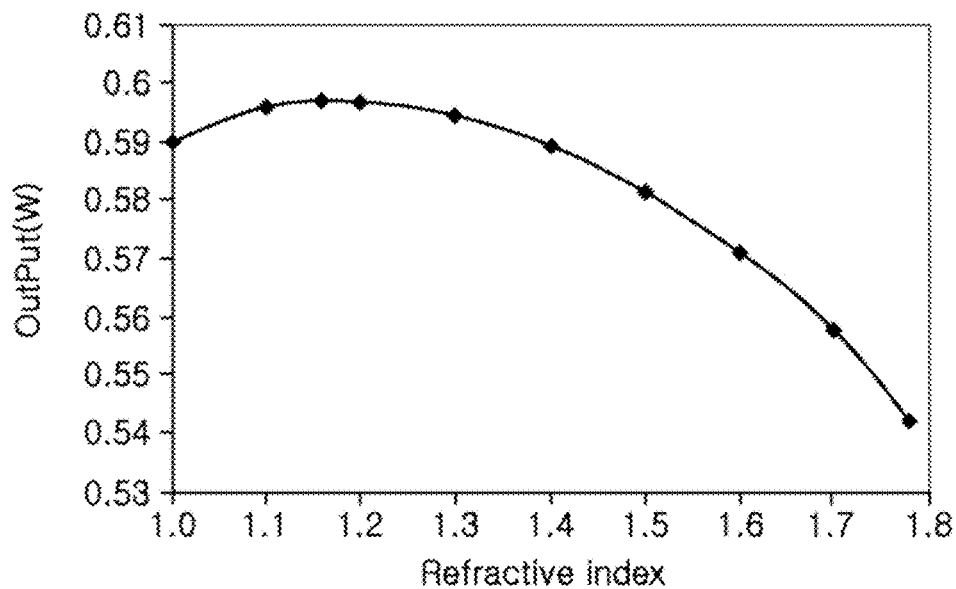
FIG. 7 is a graph illustrating a change in an output of the semiconductor light emitting device according to a refractive index of the convex portions provided on a substrate.

FIG. 7 is a graph illustrating a change in an output of the semiconductor light emitting device according to a refractive index of the convex portions provided on a substrate. FIG. 7 shows a result of simulating an output value of a semiconductor light emitting device while changing a refractive index of the convex portion formed on a sapphire substrate and having a refractive index different from that of the sapphire substrate.

Referring to FIG. 7, when a refractive index of the convex portion was smaller than 1.78, a refractive index of the sapphire substrate, an output value was increased, and it was confirmed that the output was enhanced by a maximum of 10% when the refractive index of the convex portion was 1.16, compared with the case in which the refractive index was 1.78 (in a case in which sapphire was patterned to form the convex portion). Thus, it is appropriate for the convex portion to have a refractive index ranging from 1 to 1.7.

Figure 8:
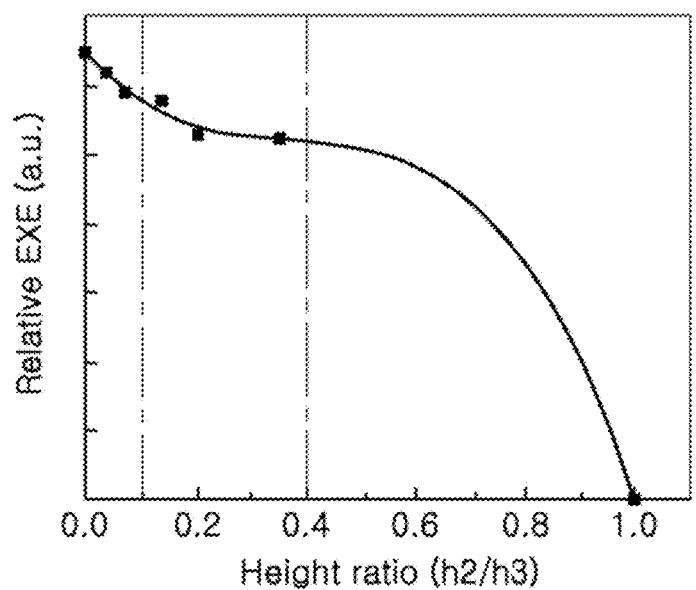
FIG. 8 is a graph illustrating relative light extraction efficiency according to a ratio of a height of a first layer to a height of the convex portion provided on the substrate.

FIG. 8 is a graph illustrating relative light extraction efficiency according to a ratio (h2/h3) of a height (h2) of the first layer to an overall height (h3) of the convex portion. FIG. 8 is a result of simulating light extraction efficiency according to the ratio of h2/h3 with respect to the semiconductor light emitting device having the convex portion having the second layer formed of $SiO_2$ and the first layer formed of the same material as that of the sapphire substrate.

Referring to FIG. 8, in a case in which the convex portion includes only the second layer formed of $SiO_2$ different from that of the sapphire substrate, that is, in a case in which when the value h2/h3 is 0, relative light extraction efficiency was highest, and in a case in which the convex portion has only the first layer formed of the same material as that of the sapphire substrate, that is, in a case in which the value h2/h3 is 1, relative light extraction efficiency was lowest. That is, as the proportion of a heterogeneous material having a refractive index different from that of the substrate is increased in the convex portion, the relative light extraction efficiency is increased. However, as mentioned above, if the sapphire substrate is not etched, etch byproducts are left on the substrate while an etching process is performed to form the second layer, and the left etch products hinder nucleation and growth of a semiconductor layer on the substrate. Thus, in order to remove the etch byproducts remaining on the substrate, preferably, the sapphire substrate is etched in such a manner that the value h2/h3 is about 0.1 to form the first layer. Meanwhile, when the value h2/h3 exceeds approximately 0.4, it is a region in which relative light extraction efficiency is drastically reduced, and thus, preferably, the value h2/h3 is maintained to be 0.4 or less. As a result, the ratio (h2/h3) of the height (h2) of the first layer to the overall height (h3) of the convex portion appropriately ranges from 0.1 to 0.4.

Figure 9:
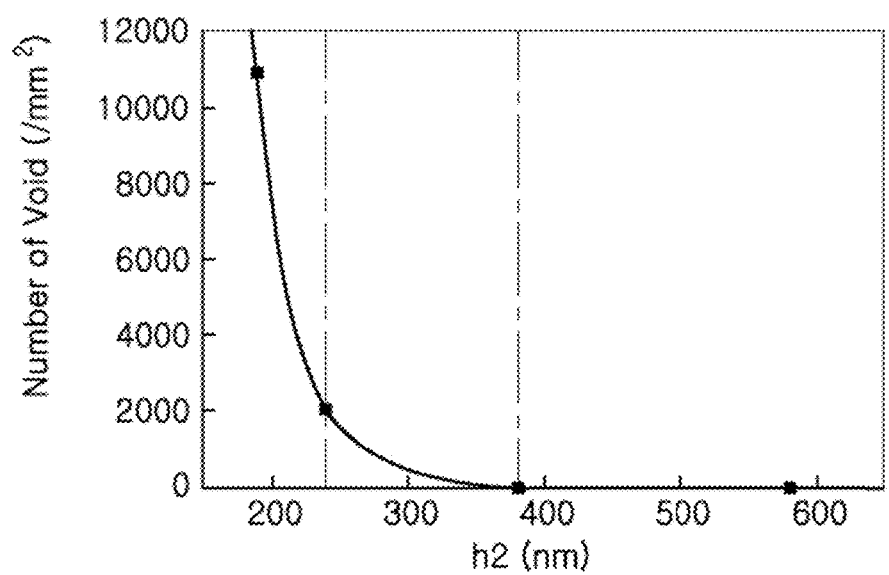
FIG. 9 is a graph illustrating the number of voids according to a height (h2) of the first layer of the convex portion provided on the substrate.

FIG. 9 is a graph illustrating the number of voids according to the height (h2) of the first layer of the convex portion, that is an etch depth of the substrate. FIG. 9 shows the result of counting the number of voids after a light emitting stack is grown on a sapphire substrate by varying the height (h2) of the first layer while the second layer formed of $SiO_2$ had the same thickness.

As illustrated in FIG. 9, the number of voids when the height h2 of the first layer was 190 nm, 240 nm, 380 nm, and 580 nm was checked. When the height h2 of the first layer was 190 nm, the number of voids was about 11,000/$mm^2$, and when the height (h2) of the first layer was 240 nm, the number of voids was drastically reduced to about 2,000/$mm^2$. This amount of the voids is sufficient for a semiconductor light emitting device to be produced as a product. When the height (h2) of the first layer was 380 nm, no void was checked. Thus, it is appropriate for the etch depth of the substrate, that is, the height (h2) of the first layer, to range from 240 nm to 380 nm.

Figure 10A:
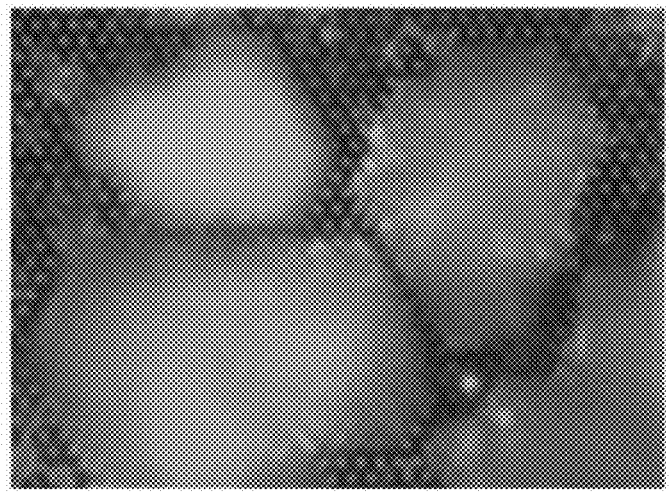
FIGS. 10A and 10B are optical microscope images illustrating an effect of an example embodiment.
Figure 10B:
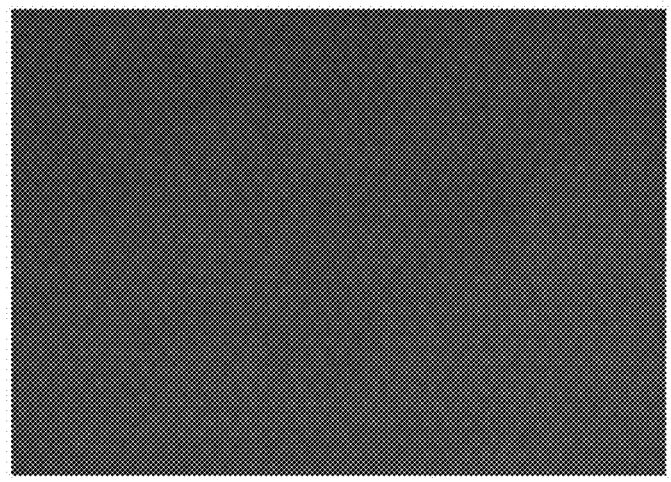

FIGS. 10A and 10B are optical microscope images illustrating an effect of an example embodiment t. FIG. 10A is comparative example in which a GaN semiconductor layer was grown on a sapphire substrate having a convex portion having a single layer structure formed of $SiO_2$. FIG. 10B is an example embodiment in which a GaN semiconductor layer was grown on a sapphire substrate having a convex portion having a dual-layer structure including a second layer formed of $SiO_2$ and a first layer formed of the same material as that of the sapphire substrate.

Referring to FIG. 10A, it can be seen that the GaN semiconductor layer was grown partially in a 3D form, rather than being uniformly grown on the entire substrate. In contrast, in FIG. 10B, it can be seen that the GaN semiconductor layer was uniformly grown on the entire surface to a 2D thin film having a smooth surface.

Figure 11:
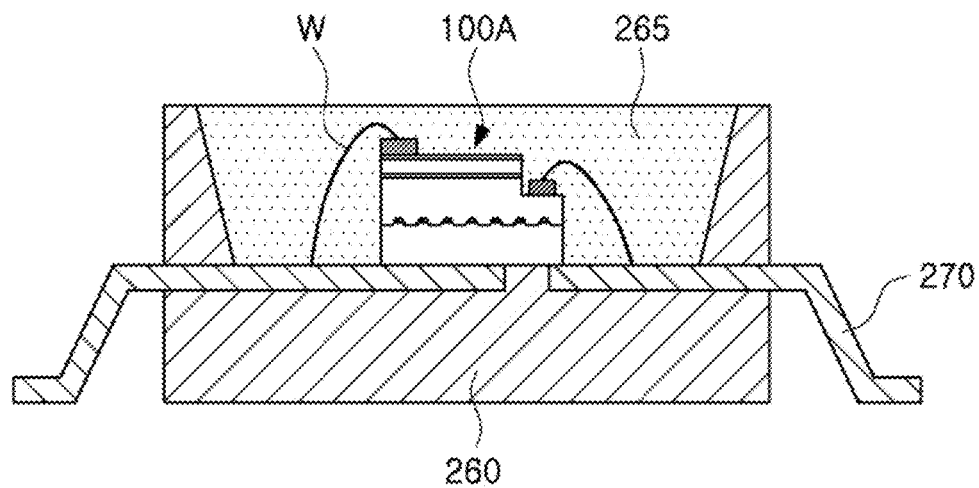
FIGS. 11 and 12 are cross-sectional views illustrating semiconductor light emitting devices according to an example embodiment.

FIG. 11 is a cross-sectional view illustrating a semiconductor light emitting device package employing a semiconductor light emitting device 100A according to an example embodiment.

The semiconductor light emitting device package illustrated in FIG. 11 includes the semiconductor light emitting device 100A illustrated in FIG. 1.

Referring to FIG. 11, the semiconductor light emitting device 100A may be mounted on a lead frame 270, and electrodes thereof may be electrically connected to the lead frame 270 by wires (W). If necessary, the semiconductor light emitting device 100A may be mounted in a region, for example, on a package body 260, other than the lead frame 270. Also, in order to enhance reflection efficiency of light, the package body 260 may have a cup-shaped recess, and an encapsulant 265 formed of a light-transmissive material may be formed in the recess to encapsulate the semiconductor light emitting device 100A and the wires W. The encapsulant 265 may contain a wavelength conversion material such as phosphors and/or quantum dots. Details of the wavelength conversion material will hereinafter be described.

Figure 12:
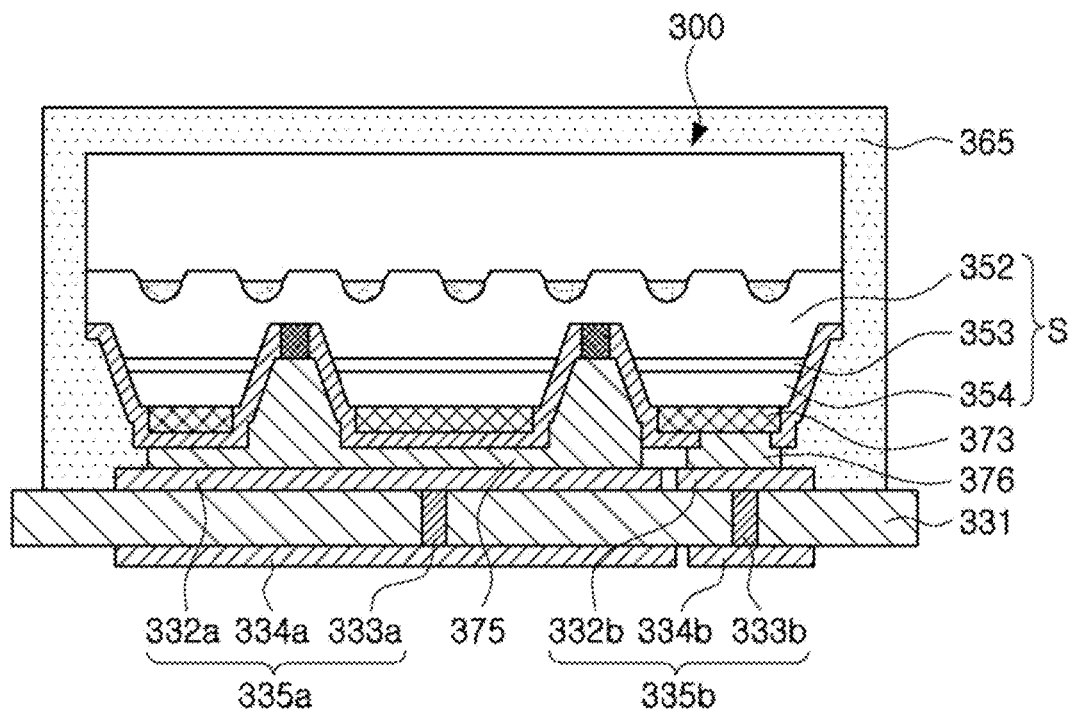

FIG. 12 is a cross-sectional view illustrating a semiconductor light emitting device package employing a semiconductor light emitting device 300 in a flip-chip manner according to an example embodiment.

The semiconductor light emitting device package illustrated in FIG. 12 includes the semiconductor light emitting device 300 illustrated in FIG. 4.

Referring to FIG. 12, a circuit board 331 has first and second wiring electrodes 335a and 335b. The first and second wiring electrodes 335a and 336b include first and second upper electrodes 332a and 332b disposed on an upper surface of the circuit board 331, first and second lower electrodes 334a and 334b disposed on a lower surface of the circuit board 331, and a first through electrode 333a connecting the first upper electrode 332a and the first lower electrode 333a and a second through electrode 333b connecting the second upper electrode 332b and the second lower electrode 333b, respectively. The circuit board 331 employed in the example embodiment is merely illustrative, and may be variously modified. For example, the circuit board 331 may be formed as a PCB such as an MCPCB, an MPCB, or an FPCB, a ceramic board such as AlN or Al2O3, or as a board with a lead frame fixed thereto.

In the semiconductor light emitting device 300, first and second pad electrodes 375 and 376 may be mounted on the circuit board 331 so that they face the circuit board 331. The first and second pad electrodes 375 and 376 may include a bonding layer such as a eutectic metal layer thereon, and may be bonded to the first and second upper electrodes 332a and 332b through the bonding layer. Alternatively, an additional bonding layer such as a eutectic metal layer or a conductive epoxy may be formed or used to bond the first and second pad electrodes 315 and 316 and the first and second upper electrodes 332a and 332b.

As illustrated in FIG. 12, a wavelength conversion part 365 may be disposed on a surface of the semiconductor light emitting device 300 in order to convert a wavelength of light emitted from the active layer 353 into a different wavelength. The wavelength conversion part 365 employed in the example embodiment may be a resin layer containing a wavelength conversion material such as quantum dots. Details of the wavelength conversion material will hereinafter be described.

Figure 13A:
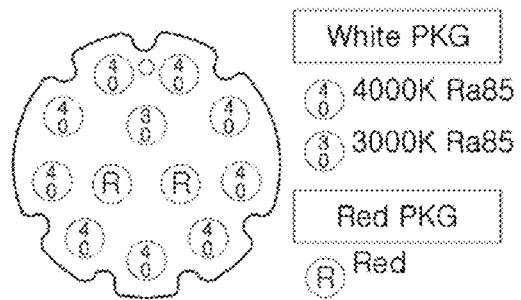
FIGS. 13A and 13B are schematic views illustrating a white light source module including a semiconductor light emitting device package according to an example embodiment.
Figure 13B:
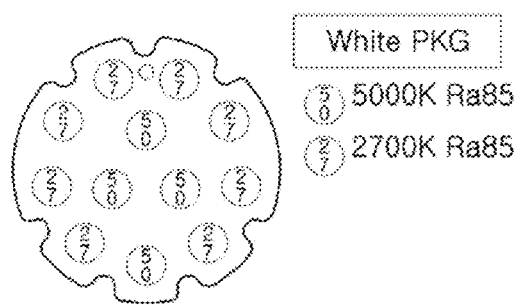

FIGS. 13A and 13B are schematic views illustrating a white light source module including a semiconductor light emitting device package according to an example embodiment.

Light source modules illustrated in FIGS. 13A and 13B may include a plurality of light emitting device packages mounted on a circuit board. A plurality of light emitting device packages mounted on a single light source module may be configured as homogenous packages generating light having the same wavelength, or as in the example embodiment, a plurality of light emitting device packages mounted on a single light source module may be configured as heterogeneous packages generating light having different wavelengths.

Referring to FIG. 13A, a white light source module may include a combination of white light emitting device packages and red light emitting device packages respectively having color temperatures of 4,000K and 3,000K. The white light source module may provide white light having a color temperature that may be adjusted to range from 3,000K to 4,000K and having a color rendering index (CRI) Ra ranging from 85 to 100.

Referring to FIG. 13B, a white light source module includes only white light emitting device packages, and some of the packages may have white light having a different color temperature. For example, by combining a white light emitting device package having a color temperature of 2,700K and a white light emitting device package having a color temperature of 5,000K, white light having a color temperature that may be adjusted to range from 2,700K to 5,000K and having a CRI Ra of 85 to 99 may be provided.

Here, the amount of light emitting device packages of each color temperature may vary depending on a basically set color temperature value. For example, in a case of a lighting device in which a basically set value is a color temperature of about 4,000K, the amount of packages corresponding to a color temperature of 4,000K may be adjusted to be greater than the amount of packages corresponding to a color temperature of 3,000K or the amount of red light emitting device packages.

In this manner, the heterogeneous light emitting device package is configured to include at least one of a light emitting device emitting white light by combining yellow, green, red, or orange phosphor to a blue light emitting device and a violet, blue, green, red, or infrared light emitting device, whereby a color temperature and CRI of white light may be adjusted.

Figure 21:
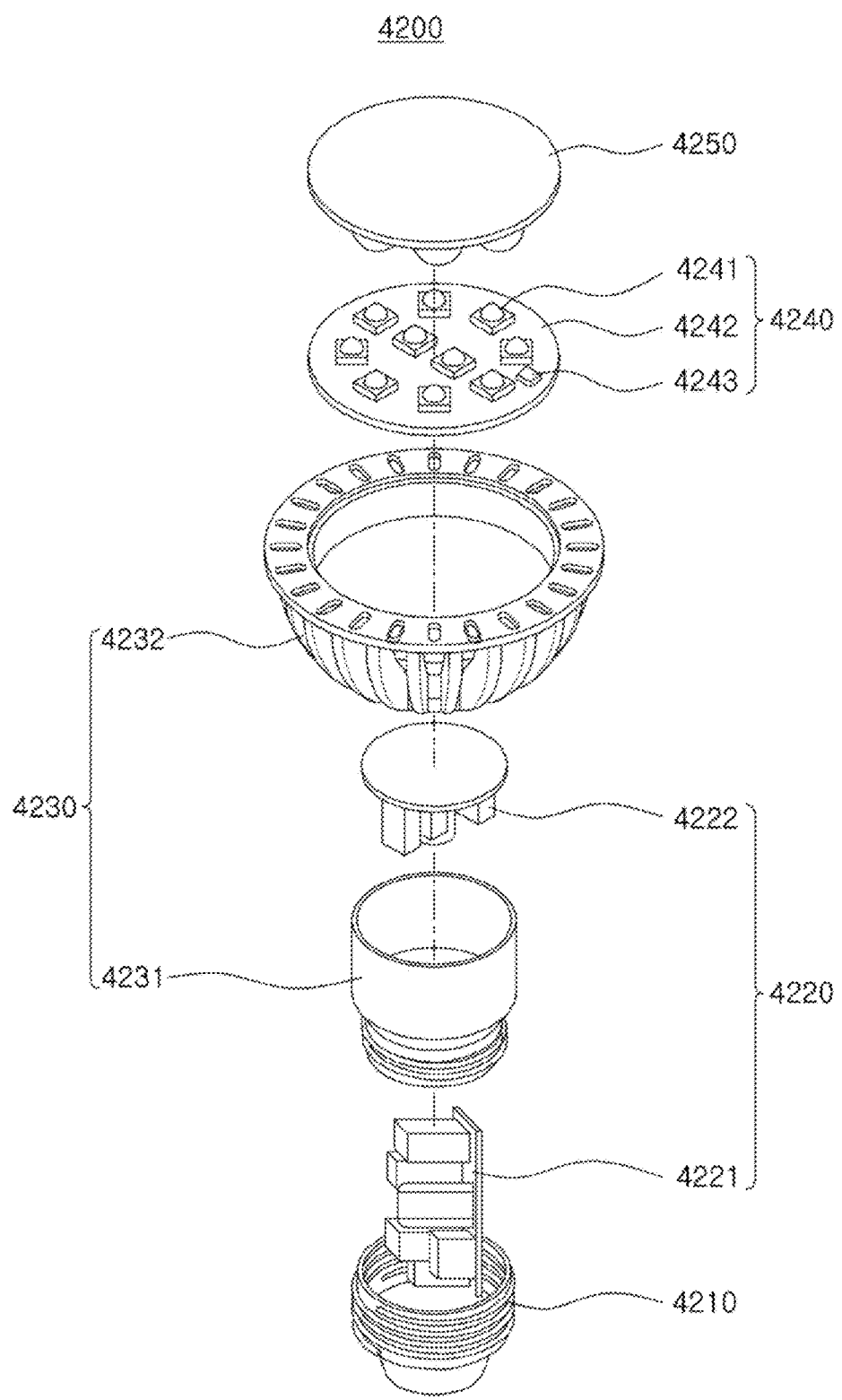
FIG. 21 is an exploded perspective view illustrating a bulb type lamp including a semiconductor light emitting device package according to an example embodiment.
Figure 22:
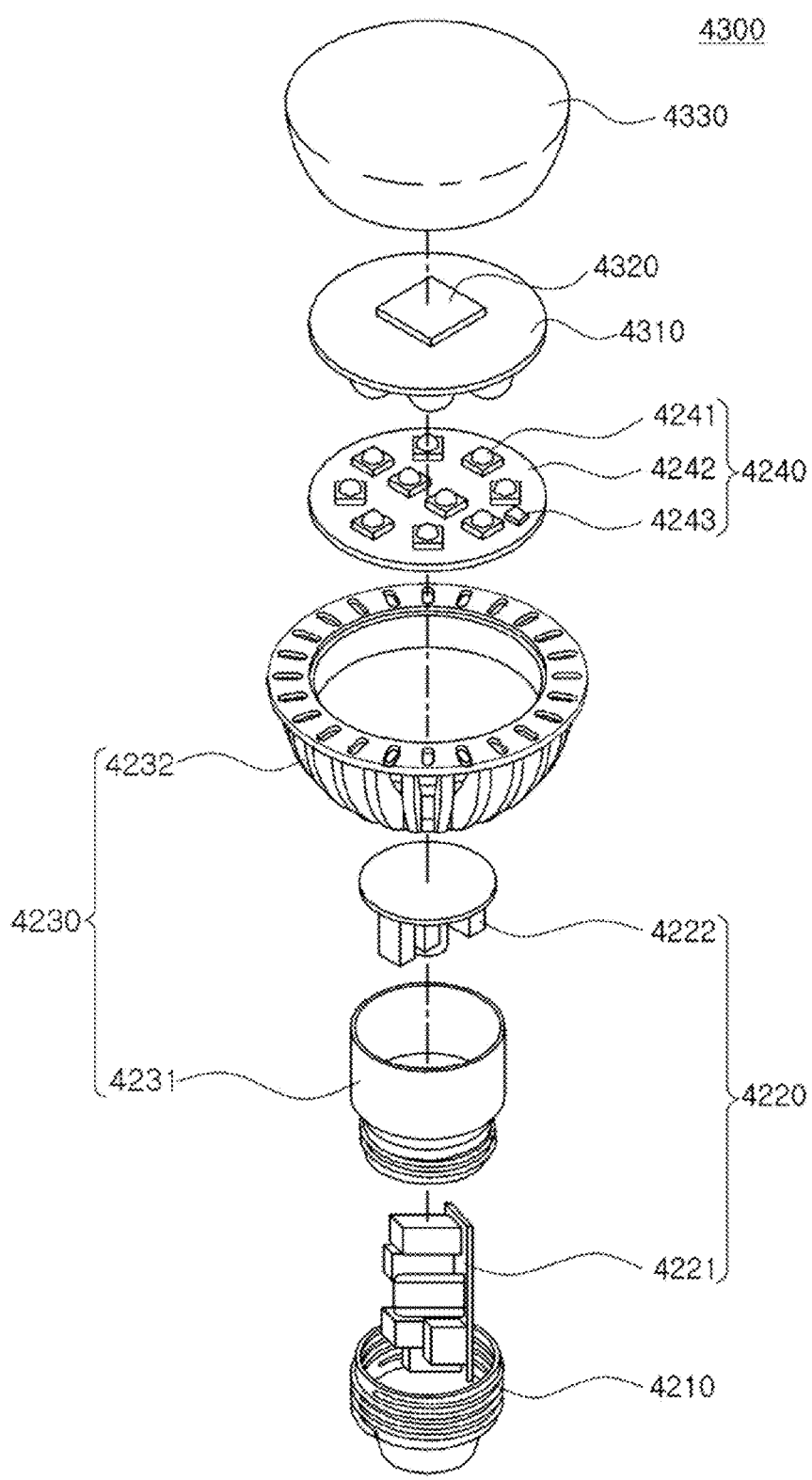
FIG. 22 is an exploded perspective view illustrating a lamp including a semiconductor light emitting device package and a communications module according to an example embodiment.

The white light source module described above may be used as a light source module 4240 of a bulb-type lighting device (please refer to FIG. 21 or 22).

In a single light emitting device package, light having a desired color is determined according to wavelengths of an LED chip as a light emitting device, and types and mixing ratios of phosphors, and in a case of white light, a color temperature and a CRI may be adjusted.

For example, in a case in which an LED chip emits blue light, a light emitting device package including at least one of yellow, green, and red phosphors may emit white light having various color temperatures according to mixing ratios of phosphors. In contrast, a light emitting device package in which a green or red phosphor is applied to a blue LED chip may emit green or red light. In this manner, a color temperature or a CRI of white light may be adjusted by combining a light emitting device package emitting white light and a light emitting device package emitting green or red light. Also, at least one of light emitting devices emitting violet, blue, green, red, or infrared light may be included.

In this case, the lighting device may control a color rendering index (CRI) to range from the level of light emitted by a sodium lamp to the level of sunlight, and control a color temperature ranging from 1,500K to 20,000K to generate various levels of white light. If necessary, the lighting device may generate visible light having violet, blue, green, red, orange colors, or infrared light to adjust an illumination color according to a surrounding atmosphere or mood. Also, the lighting device may generate light having a special wavelength stimulating plant growth.

Figure 14:
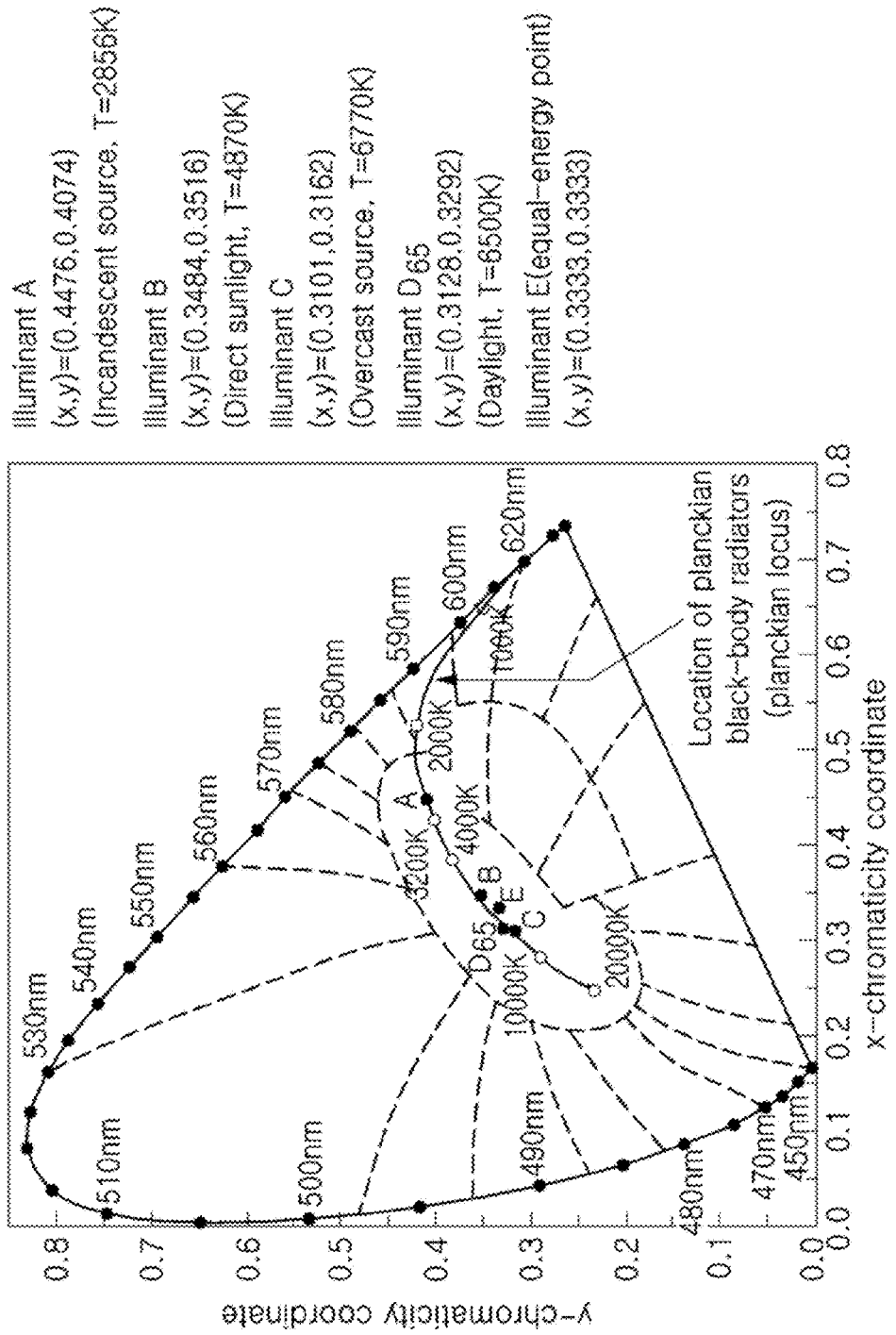
FIG. 14 is a CIE 1931 color space chromaticity diagram illustrating wavelength conversion materials that may be employed in a semiconductor light emitting device package according to an example embodiment.

FIG. 14 is a CIE 1931 color space chromaticity diagram illustrating wavelength conversion materials that may be employed in a semiconductor light emitting device package according to an example embodiment.

Figure 20:
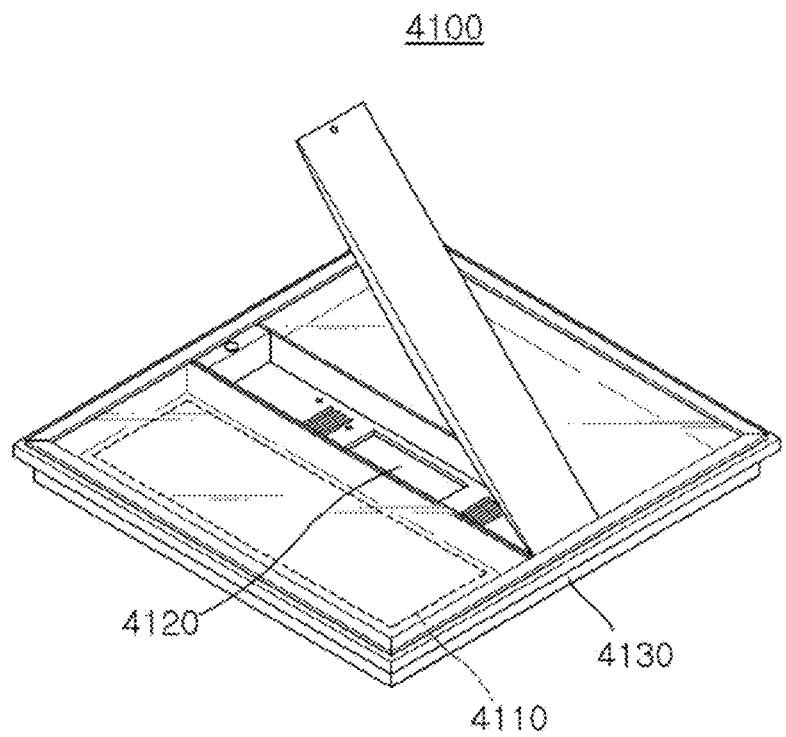
FIG. 20 is a perspective view illustrating a planar type lighting device including a semiconductor light emitting device package according to an example embodiment.

Referring to the CIE 1931 color space chromaticity diagram illustrated in FIG. 14, white light generated by combining yellow, green, and red phosphors to a UV or blue LED and/or by combining green and red LEDs thereto may have two or more peak wavelengths, and, as illustrated in FIG. 20, (x,y) coordinates may be positioned in a segment linking (0.4476, 0.4074), (0.3484, 0.3516), (0.3101, 0.3162), (0.3128, 0.3292), (0.3333, 0.3333) of the CIE 1931 color space chromaticity diagram. Alternatively, the (x,y) coordinates may be positioned in a region surrounded by the segment and a spectrum of black body radiation. A color temperature of white light corresponds to a range from about 1,500K to about 20,000K. In FIG. 14, white light in the vicinity of the point E (0.3333, 0.3333) present in a lower portion of the spectrum of black body radiation is in a state in which light of a yellow component is relatively weak, which may be used as a light source for illumination in a region which a vivid or fresh feeling for the naked eye is provided. Thus, lighting products using white light in the vicinity of the point E (0.3333, 0.3333) in the lower portion of the spectrum of black body radiation may be effectively used as lighting in stores selling groceries or clothes.

Various materials such as phosphors and/or quantum dots may be used as materials for converting a wavelength of light emitted from a semiconductor light emitting device.

Phosphors may have the following empirical formulas and colors:

Oxides: Yellow and green $Y_3Al_5O_{12}$:Ce, $Tb_3Al_5O_{12}$:Ce, $Lu_3Al_5O_{12}$:Ce Silicates: Yellow and green $(Ba,Sr)_2SiO_4$:Eu, yellow and orange $(Ba,Sr)_3SiO_5$:Ce Nitrides: Green β-SiAlON:Eu, yellow $La_3Si_6N_{11}$:Ce, orange α-SiAlON:Eu, red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_x Si_{12-y}Al_yO_{3+x+y}N_{18-x-y}$, where 0.5≤x≤3, 0<z<0.3, and 0≤y≤4—Equation (1)

In Equation (1), Ln may be at least one type of element selected from the group consisting of Group IIIa elements and rare earth elements, and M may be at least one type of element selected from the group consisting of calcium (Ca), barium (Ba), strontium (Sr), and magnesium (Mg).

Fluorides: KSF-based red $K_2SiF_6$:$Mn^{4+}$, $K_2TiF_6$:$Mn^{4+}$, $NaYF_4$:$Mn^{4+}$, $NaGdF_4$:$Mn^{4+}$, $K_3SiF_7$:$Mn^{4+}$.

Phosphor compositions should basically conform with stoichiometry, and respective elements may be substituted with different elements of respective groups of the periodic table. For example, strontium (Sr) may be substituted with barium (Ba), calcium (Ca), magnesium (Mg), and the like, of alkali earth elements, and yttrium (Y) may be substituted with terbium (Tb), lutetium (Lu), scandium (Sc), gadolinium (Gd), and the like. Also, europium (Eu), an activator, may be substituted with cerium (Ce), terbium (Tb), praseodymium (Pr), erbium (Er), ytterbium (Yb), and the like, according to a desired energy level, and an activator may be applied alone, or a coactivator, or the like, may be additionally applied to change characteristics.

In particular, in order to enhance reliability at high temperatures and high humidity, the fluoride-based red phosphor may be coated with a fluoride not containing manganese (Mn) or further include an organic substance coated on a surface of the fluoride coating not containing manganese (Mn). Unlike any other phosphor, the fluoride-based red phosphor may realize a narrow full width at half maximum (FWHM) equal to or less than 40 nm, and thus, it may be utilized in high resolution TVs such as UHD TVs.

Table 1 below illustrates types of phosphors in applications fields of white light emitting devices using a blue LED chip (wavelength: 440 nm to 460 nm) or a UV LED chip (wavelength: 380 nm to 440 nm).

or in a semiconductor light emitting device package according to an example embodiment.

Figure 15:
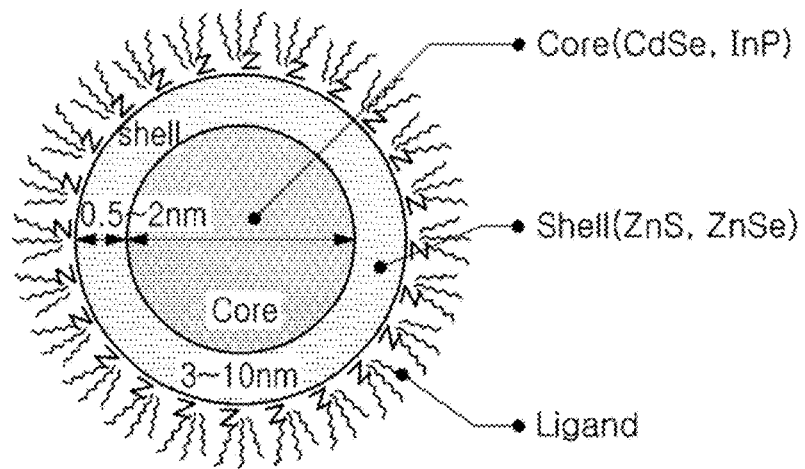
FIG. 15 is a cross-sectional view of a quantum dot that may be employed in a semiconductor light emitting device package according to an example embodiment.

Referring to FIG. 15, a quantum dot (QD) may have a core-shell structure including Group II-VI or Group III-V compound semiconductors. For example, the quantum dot may have a core such as CdSe or InP, or a shell such as ZnS or ZnSe. Also, the quantum dot may include a ligand to stabilize the core and shell. For example, the core may have a diameter ranging from 1 nm to 30 nm, and preferably 3 nm to 10 nm. The shell may have a thickness ranging from 0.1 nm to 20 nm, and preferably 0.5 nm to 2 nm.

The quantum dot may implement various colors according to sizes and, in particular, when the quantum dot is used as a phosphor substitute, it may be used as a red or green phosphor. The use of a quantum dot may implement a narrow FWHM (e.g., about 35 nm).

The wavelength conversion material may be implemented in the form of being contained in an encapsulator (please refer to FIGS. 11 and 12), or alternatively, the wavelength conversion material may be manufactured as a film in advance and attached to a surface of an optical structure such as an LED chip or a light guide plate so as to be used (please refer to FIGS. 22, 23A, and 23B). In this case, the wavelength conversion material having a uniform thickness may be easily applied to a desired region.

Figure 16:
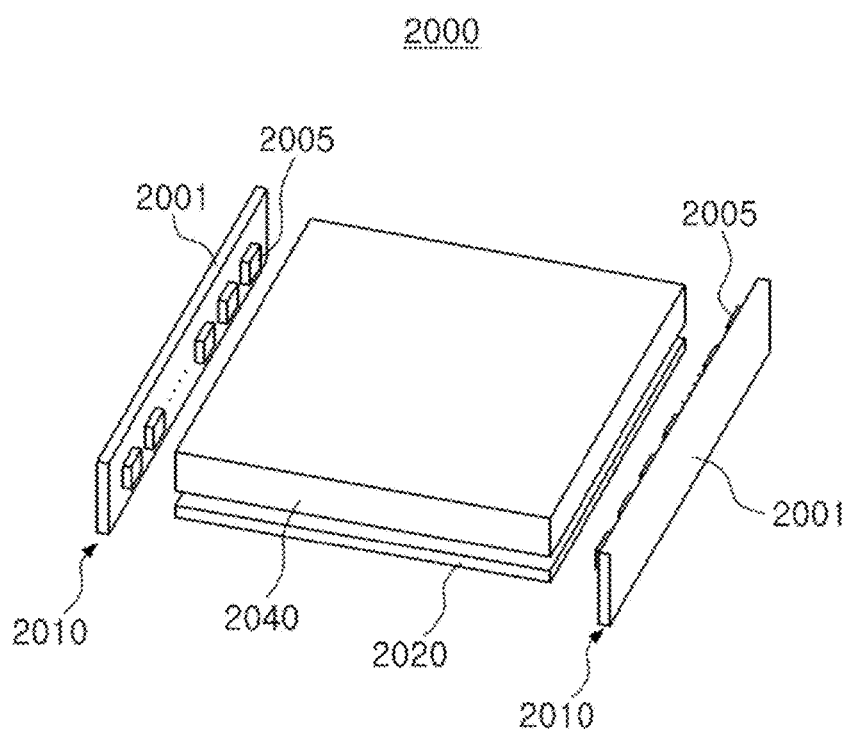
FIG. 16 is a perspective view illustrating a backlight unit including a semiconductor light emitting device package according to an example embodiment.

FIG. 16 is a perspective view illustrating a backlight unit including a semiconductor light emitting device package according to an example embodiment.

Referring to FIG. 16, a backlight unit 2000 may include a light guide plate 2040 and light source modules 2010 provided on both sides of the light guide plate 2040. Also, the backlight unit 2000 may further include a reflective plate 2020 disposed below the light guide plate 2040. The backlight unit 2000 according to the example embodiment may be an edge type backlight unit.

According to an example embodiment, the light source module 2010 may only be provided on one side of the light guide plate 2040 or may further be provided on the other side thereof. The light source module 2010 may include a printed circuit board (PCB) 2001 and a plurality of light

TABLE 1

| Purpose | Phosphor |
| --- | --- |
| LED TV BLU | β-SiAlON:$Eu^{2+}$, (Ca, Sr)AlSiN$_3$:$Eu^{2+}$, La$_3$Si$_6$N$_{11}$:$Ce^{3+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$(0.5 ≤ x ≤ 3, 0 < z < 0.3, 0 < y ≤ 4), K$_2$TiF$_6$:$Mn^{4+}$, NaYF$_4$:$Mn^{4+}$, NaGdF$_4$:$Mn^{4+}$, K$_3$SiF$_7$:$Mn^{4+}$ |
| Lighting | Lu$_3$Al$_5$O$_{12}$:$Ce^{3+}$, Ca-α-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$(0.5 ≤ x ≤ 3, 0 < z < 0.3, 0 < y ≤ 4), K$_2$TiF$_6$:$Mn^{4+}$, NaYF$_4$:$Mn^{4+}$, NaGdF$_4$:$Mn^{4+}$, K$_3$SiF$_7$:$Mn^{4+}$ |
| Side viewing (Mobile devices, Laptop PCs) | Lu$_3$Al$_5$O$_{12}$:$Ce^{3+}$, Ca-α-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, (Sr, Ba, Ca, Mg)$_2$SiO$_4$:$Eu^{2+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$ (0.5 ≤ x ≤ 3, 0 < z < 0.3, 0 < y ≤ 4), K$_2$TiF$_6$:$Mn^{4+}$, NaYF$_4$:$Mn^{4+}$, NaGdF$_4$:$Mn^{4+}$, K$_3$SiF$_7$:$Mn^{4+}$ |
| Electrical components (Headlamps, etc.) | Lu$_3$Al$_5$O$_{12}$:$Ce^{3+}$, Ca-α-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$(0.5 ≤ x ≤ 3, 0 < z < 0.3, 0 < y ≤ 4), K$_2$TiF$_6$:$Mn^{4+}$, NaYF$_4$:$Mn^{4+}$, NaGdF$_4$:$Mn^{4+}$, K$_3$SiF$_7$:$Mn^{4+}$ |

Also, the wavelength conversion unit may be formed of wavelength conversion materials such as quantum dots (QD), and here, the quantum dots may be used in place of phosphors or may be mixed with phosphors so as to be used.

FIG. 15 is a cross-sectional view of a quantum dot that may be employed in a semiconductor light emitting device sources 2005 mounted on an upper surface of the PCB 2001. Here, the light source 2005 may include the semiconductor light emitting devices according to example embodiments.

Figure 17:
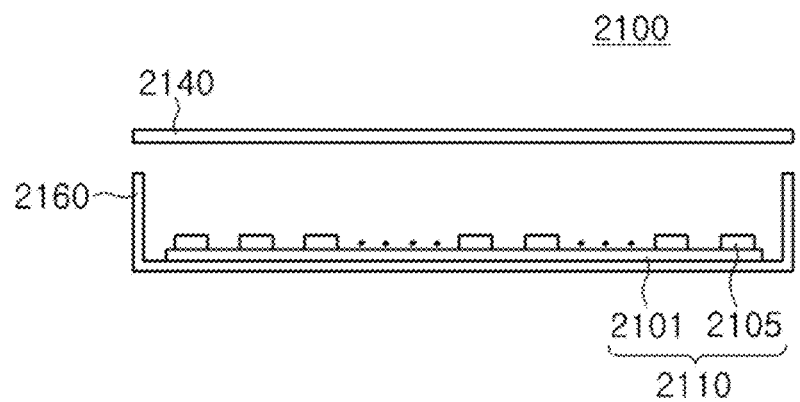
FIG. 17 is a cross-sectional view illustrating a direct type backlight unit including a semiconductor light emitting device package according to an example embodiment.

FIG. 17 is a cross-sectional view illustrating a direct type backlight unit including a semiconductor light emitting device package according to an example embodiment.

Referring to FIG. 17, a backlight unit 2100 may include a light diffuser 2140 and a light source module 2110 arranged below the light diffuser 2140. Also, the backlight unit 2100 may further include a bottom case 2160 disposed below the light diffuser 2140 and accommodating the light source module 2110. The backlight unit 2100 according to the example embodiment may be a direct type backlight unit. Here, the light source 2105 may include the semiconductor light emitting devices according to example embodiments.

Figure 18:
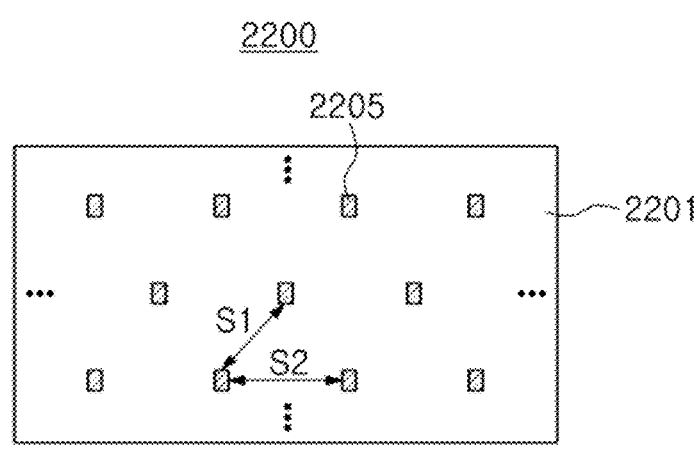
FIG. 18 is a view illustrating a disposition of light sources in a direct type backlight unit including a semiconductor light emitting device package according to an example embodiment.

FIG. 18 is a view illustrating a disposition of light sources in a direct type backlight unit including a semiconductor light emitting device package according to an example embodiment.

Referring to FIG. 18, a direct type backlight unit 2200 according to the example embodiment may include a plurality of light sources 2205 arranged on a board 2201. Here, the light source 2205 may include the semiconductor light emitting devices according to example embodiments.

The arrangement structure of the light sources 2205 is a matrix structure in which the light sources 2205 are arranged in rows and columns, and here, the rows and columns have a zigzag form. This is a structure in which a second matrix having the same form as that of a first matrix is disposed within the first matrix in which the plurality of light sources 2205 are arranged in rows and columns in straight lines, which may be understood as that each light source 2205 of the second matrix is positioned within a quadrangle formed by four adjacent light sources 2205 included in the first matrix.

However, in the direct type backlight unit, in order to enhance uniformity of brightness and light efficiency, if necessary, the first and second matrices may have different disposition structures and intervals. Also, in addition to the method of disposing the plurality of light sources, distances S1 and S2 between adjacent light sources may be optimized to secure uniformity of brightness.

Because the rows and columns of the light sources 2205 are disposed in a zigzag manner, rather than being disposed in straight lines, the number of light sources 2205 may be reduced by about 15% to 25% with respect to the same light emitting area.

Figure 19:
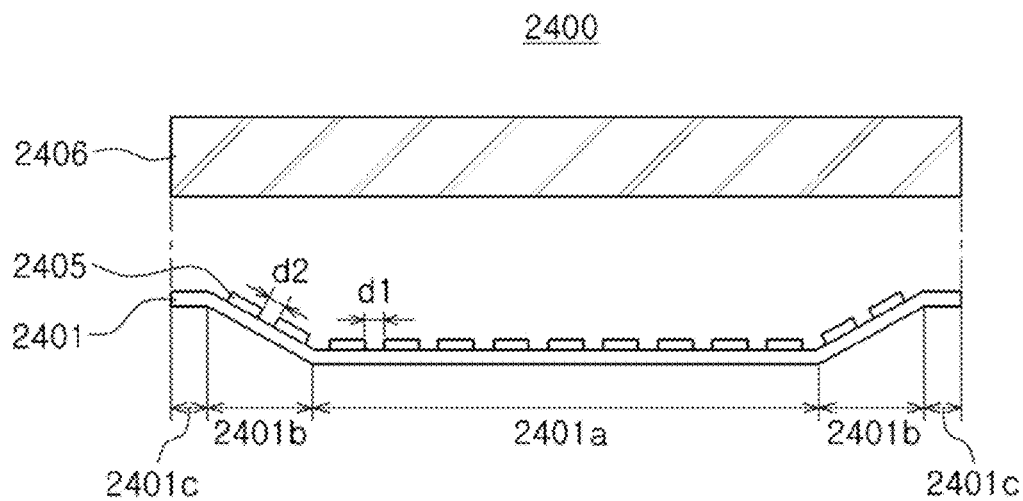
FIG. 19 is a cross-sectional view illustrating a direct type backlight unit including a semiconductor light emitting device package according to an example embodiment.

FIG. 19 is a cross-sectional view illustrating a direct type backlight unit including a semiconductor light emitting device package according to an example embodiment.

Referring to FIG. 19, a backlight unit 2400 includes at least one light source 2405 mounted on a circuit board 2401 and at least one optical sheet 2406 disposed thereabove. Here, the light source 2405 may include the semiconductor light emitting devices according to example embodiments.

The circuit board 2401 employed in the example embodiment may have a first planar portion 2401a corresponding to a main region, a sloped portion 2401b disposed around the first planar portion 2401a and bent in at least a portion thereto, and a second planar portion 2401c disposed on the edge of the circuit board 2501, namely, an outer side of the sloped portion 2401b. The light sources 2405 are arranged at a first interval d1 on the first planar portion 2401a, and one or more light sources 2405 may also be arranged at a second interval d2 on the sloped portion 2401b. The first interval d1 may be equal to the second interval d2. A width of the sloped portion 2401b (or a length in the cross-section) may be narrower than that of the first planar portion 2401a and may be wider than a width of the second planar portion 2401c. Also, if necessary, at least one light source 2405 may be arranged on the second planar portion 2401c.

A slope of the sloped portion 2401b may be appropriately adjusted within a range from 0 to 90 degrees with respect to the first planar portion 2401a, and with this structure, the circuit board 2401 may maintain uniform brightness even in the vicinity of the edge of the optical sheet 2406.

FIG. 20 is a perspective view illustrating a planar type lighting device including a semiconductor light emitting device package according to an example embodiment.

Referring to FIG. 20, a planar type lighting device 4100 may include a light source module 4110, a power supply device 4120, and a housing 4130. According to an example embodiment, the light source module 4110 may include a light emitting device array as a light source, and the power supply device 4120 may include a light emitting device driving unit.

The light source module 4110 may include a light emitting device array and may be formed to have an overall planar shape. According to an example embodiment, the light emitting device array may include a light emitting device and a controller storing driving information of the light emitting device. Here, the light emitting device may include the semiconductor light emitting devices according to example embodiments.

The power supply device 4120 may be configured to supply power to the light source module 4110. The housing 4130 may have an accommodation space accommodating the light source module 4110 and the power supply device 4120 therein and have a hexahedral shape with one side thereof opened, but the shape of the housing 4130 is not limited thereto. The light source module 4110 may be disposed to emit light to the opened one side of the housing 4130.

FIG. 21 is an exploded perspective view illustrating a bulb type lamp including a semiconductor light emitting device package according to an example embodiment.

Referring to FIG. 21, a lighting device 4200 may include a socket 4210, a power source unit 4220, a heat dissipation unit 4230, a light source module 4240, and an optical unit 4250. According to an example embodiment, the light source module 4240 may include a light emitting device array, and the power source unit 4220 may include a light emitting device driving unit.

The socket 4210 may be configured to be replaced with an existing lighting device. Power supplied to the lighting device 4200 may be applied through the socket 4120. As illustrated, the power source unit 4220 may include a first power source unit 4221 and a second power source unit 4222. The first power source unit 4221 and the second power source unit 4222 may be assembled to form the power source unit 4220. The heat dissipation unit 4230 may include an internal heat dissipation unit 4231 and an external heat dissipation unit 4232. The internal heat dissipation unit 4231 may be directly connected to the light source module 4240 and/or the power source unit 4220 in order to transmit heat to the external heat dissipation unit 4232. The optical unit 4250 may include an internal optical unit (not shown) and an external optical unit (not shown) and may be configured to evenly distribute light emitted from the light source module 4240.

The light source module 4240 may emit light to the optical unit 4250 upon receiving power from the power source unit 4220. The light source module 4240 may include one or more light emitting devices 4241, a circuit board 4242, and a controller 4243. The controller 4243 may store driving information of the light emitting devices 4241. Here, the light emitting device 4241 may include the semiconductor light emitting devices according to example embodiments.

FIG. 22 is an exploded perspective view illustrating a lamp including a semiconductor light emitting device package and a communications module according to an example embodiment.

Referring to FIG. 22, a lighting device 4300 according to the example embodiment is different from the lighting device 4200 illustrated in FIG. 21 in that a reflective plate 4310 is provided above the light source module 4240, and here, the reflective plate 4310 serves to allow light from the light source to be evenly spread laterally and backwardly, reducing glare.

A communications module 4320 may be mounted on an upper portion of the reflective plate 4310, and home network communication may be implemented through the communications module 4320. For example, the communications module 4320 may be a wireless communications module using ZigBee, Wi-Fi, or visible light communications (VLC) technology (or light fidelity (Li-Fi)), and may control lighting installed within or outside of a household, such as turning on or off a lighting device, adjusting brightness of a lighting device, and the like, through a smartphone or a wireless controller. Also, home appliances or an automobile system within or outside of a household, such as a TV, a refrigerator, an air-conditioner, a door lock, or automobiles, and the like, may be controlled through a Li-Fi communications module using visible wavelengths of the lighting device installed within or outside of the household.

The reflective plate 4310 and the communications module 4320 may be covered by a cover unit 4330.

Figure 23:
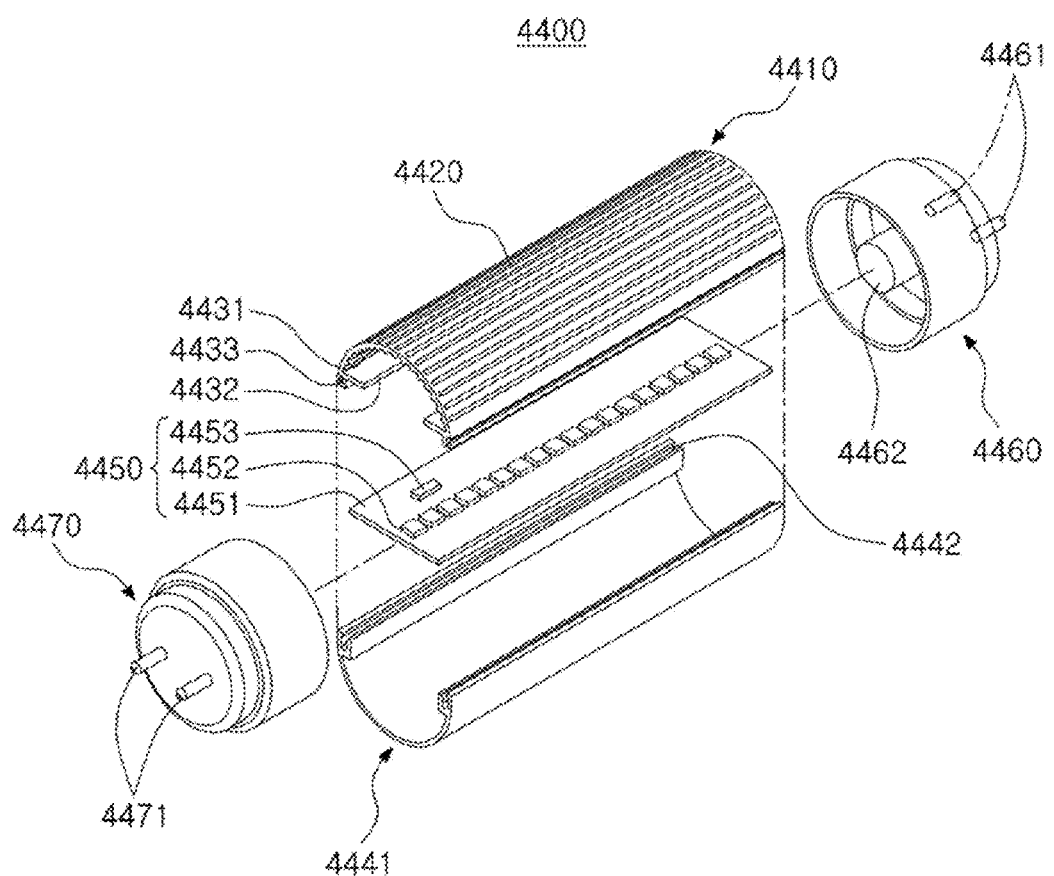
FIG. 23 is an exploded perspective view illustrating a bar-type lamp including a semiconductor light emitting device package according to an example embodiment.

FIG. 23 is an exploded perspective view illustrating a bar-type lamp including a semiconductor light emitting device package according to an example embodiment.

Referring to FIG. 23, a lighting device 4440 includes a heat dissipation member 4410, a cover 4441, a light source module 4450, a first socket 4460, and a second socket 4470. A plurality of heat dissipation fins 4420 and 4431 may be formed in a concavo-convex pattern on an internal or/and external surface of the heat dissipation member 4410, and the heat dissipation fins 4420 and 4431 may be designed to have various shapes and intervals (spaces) therebetween. A support 4432 having a protruding shape is formed on an inner side of the heat dissipation member 4410. The light source module 4450 may be fixed to the support 4432. Stoppage protrusions 4433 may be formed on both ends of the heat dissipation member 4410.

The stoppage recesses 4442 may be formed in the cover 4441, and the stoppage protrusions 4433 of the heat dissipation member 4410 may be coupled to the stoppage recesses 4442. The positions of the stoppage recesses 4442 and the stoppage protrusions 4433 may be interchanged.

The light source module 4450 may include a light emitting device array. The light source module 4450 may include a PCB 4451, a light source 4452, and a controller 4453. As described above, the controller 4453 may store driving information of the light source 4452. Circuit wirings are formed on the PCB 4451 to operate the light source 4452. Also, components for operating the light source 4452 may be provided. The light source 4452 may include the semiconductor light emitting devices according to example embodiments.

The first and second sockets 4460 and 4470, a pair of sockets, are coupled to both ends of the cylindrical cover unit including the heat dissipation member 4410 and the cover 4441. For example, the first socket 4470 may include electrode terminals 4461 and a power source device 4462, and dummy terminals 4471 may be disposed on the second socket 4470. Also, an optical sensor and/or a communications module may be installed in either the first socket 4460 or the second socket 4470. For example, the optical sensor and/or the communications module may be installed in the second socket 4470 in which the dummy terminals 4471 are disposed. In another example, the optical sensor and/or the communications module may be installed in the first socket 4460 in which the electrode terminals 4461 are disposed.

Figure 24:
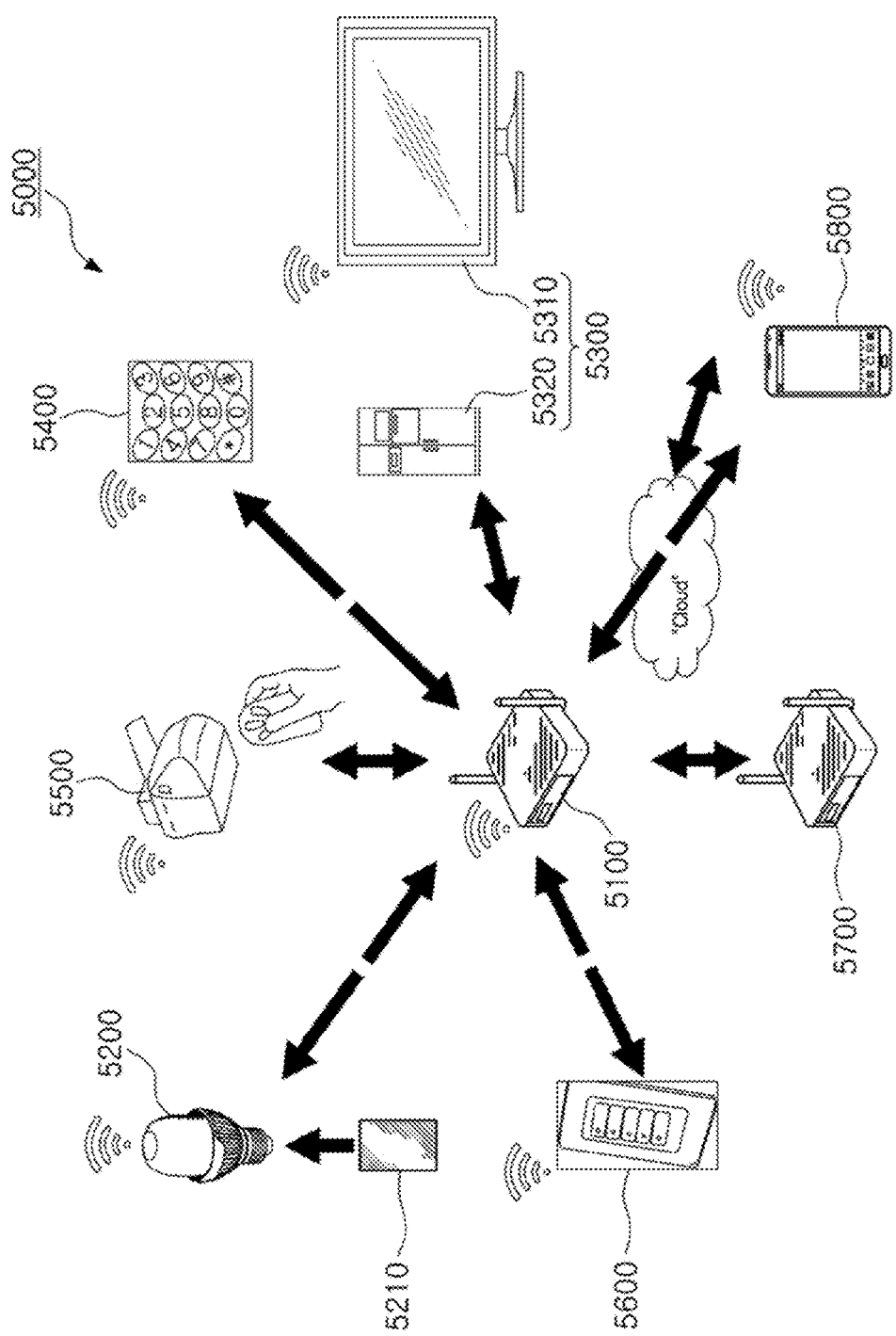
FIG. 24 is a view schematically illustrating an indoor lighting control network system including a semiconductor light emitting device package according to an example embodiment.

FIG. 24 is a view schematically illustrating an indoor lighting control network system including a semiconductor light emitting device package according to an example embodiment.

Referring to FIG. 24, a network system 5000 may be a complex smart lighting-network system combining lighting technology using a light emitting device such as an LED, or the like, Internet of Things (IoT) technology, a wireless communications technology, and the like. The network system 5000 may be implemented using various lighting devices and wired/wireless communications devices, and may be implemented by a sensor, a controller, a communications unit, software for network control and maintenance, and the like.

The network system 5000 may be applied even to an open space such as a park or a street, as well as to a closed space defined within a building such as a home or an office. The network system 5000 may be realized on the basis of the IoT environment in order to collect and process a variety of information and provide the same to users. Here, an LED lamp 5200 included in the network system 5000 may serve to check and control operational states of other devices 5300 to 5800 included in the IoT environment on the basis of a function such as visible light communications, or the like, of the LED lamp 5200, as well as receiving information regarding a surrounding environment from a gateway 5100 and controlling lighting of the LED lamp 5200 itself.

Referring to FIG. 24, the network system 5000 may include the gateway 5100 processing data transmitted and received according to different communications protocols, the LED lamp 5200 connected to be available for communicating with the gateway 5100 and including an LED light emitting device, and a plurality of devices 5300 to 5800 connected to be available for communicating with the gateway 5100 according to various wireless communications schemes. In order to realize the network system 5000 on the basis of the IoT environment, each of the devices 5300 to 5800, as well as the LED lamp 5200, may include at least one communications module. In an example embodiment, the LED lamp 5200 may be connected to be available for communicating with the gateway 5100 according to wireless communication protocols such as Wi-Fi, ZigBee, or Li-Fi, and to this end, the LED lamp 5200 may include at least one communications module 5210 for a lamp. The LED lamp 5200 may include the semiconductor light emitting devices according to example embodiments.

As mentioned above, the network system 5000 may be applied even to an open space such as a park or a street, as well as to a closed space such as a home or an office. When the network system 5000 is applied to a home, the plurality of devices 5300 to 5800 included in the network system and connected to be available for communicating with the gateway 5100 on the basis of the IoT technology may include a home appliance 5300, a digital door lock 5400, a garage door lock 5500, a lighting switching 5600 installed on a wall, or the like, a router 5700 for relaying a wireless communication network, and a mobile device 5800 such as a smartphone, a tablet PC, or a laptop computer.

In the network system 5000, the LED lamp 5200 may check operational states of various devices 5300 to 5800 using the wireless communications network (ZigBee, Wi-Fi, LI-Fi, etc.) installed in a household or automatically control illumination of the LED lamp 5200 itself according to a surrounding environment or situation. Also, the devices 5300 to 5800 included in the network system 500 may be controlled using Li-Fi communications using visible light emitted from the LED lamp 5200.

First, the LED lamp 5200 may automatically adjust illumination of the LED lamp 5200 on the basis of information of a surrounding environment transmitted from the gateway 5100 through the communications module 5210 for a lamp or information of a surrounding environment collected from a sensor installed in the LED lamp 5200. For example, brightness of illumination of the LED lamp 5200 may be automatically adjusted according to types of programs broadcast on the TV 5310 or brightness of a screen. To this end, the LED lamp 5200 may receive operation information of the TV 5310 from the communications module 5210 for a lamp connected to the gateway 5100. The communications module 5210 for a lamp may be integrally modularized with a sensor and/or a controller included in the LED lamp 5200.

For example, in a case in which a program broadcast on TV is a drama, a color temperature of illumination may be decreased to be 12000K or lower, for example, to 5000K, and a color tone may be adjusted according to preset values to present a cozy atmosphere. Conversely, when a program a comedy, the network system 5000 may be configured so that a color temperature of illumination is increased to 5000K or higher according to a preset value and illumination is adjusted to blue-based white light.

Also, in a situation in which no one is in a home, when a predetermined time has lapsed after the digital door lock 5400 is locked, all of the turned-on LED lamps 5200 are turned off to prevent a waste of electricity. Also, in a case in which a security mode is set through the mobile device 5800, or the like, when the digital door lock 5400 is locked with no one in a home, the LED lamp 5200 may be maintained in a turned-on state.

An operation of the LED lamp 5200 may be controlled according to surrounding environments collected through various sensors connected to the network system 5000. For example, in a case in which the network system 5000 is realized in a building, lighting, a position sensor, and a communications module are combined in the building, and position information of people in the building is collected and lighting is turned on or turned off, or the collected information may be provided in real time to effectively manage facilities or effectively utilize an idle space. In general, a lighting device such as the LED lamp 5200 is disposed in almost every space of each floor of a building, and thus, various types of information of the building may be collected through a sensor integrally provided with the LED lamp 5200 and used for managing facilities and utilizing an idle space.

The LED lamp 5200 may be combined with an image sensor, a storage device, and the communications module 5210 for a lamp, so as to be utilized as a device for maintaining building security or sense and cope with an emergency situation. For example, in a case in which a smoke or temperature sensor, or the like, is attached to the LED lamp 5200, a fire may be promptly sensed to minimize damage. Also, brightness of lighting may be adjusted in consideration of a weather outside or an amount of sunshine, thereby saving energy and providing an agreeable illumination environment.

As set forth above, according to example embodiments, because the semiconductor light emitting device has the convex portion including a heterogeneous material and provided in the interface between the substrate and the semiconductor layer, light extraction efficiency thereof may be enhanced.

While example embodiments have been shown and described above, it will be apparent to those skilled in the art that modifications and variations could be made without departing from the scope of the inventive concept as defined by the appended claims.

What is claimed is:

1. A semiconductor light emitting device comprising:
 a substrate formed of a first material; and
 a convex portion protruding from the substrate and comprising:
  a first layer formed of the first material as that of the substrate; and
  a second layer formed of a second material different from the first material and disposed on the first layer,
 wherein a second maximum height of the second layer is greater than a first maximum height of the first layer, the first maximum height and the second maximum height being measured in a thickness direction of the semiconductor light emitting device, and
 wherein the first maximum height of the first layer is measured from a surface of the substrate surrounding the convex portion.

2. The semiconductor light emitting device of claim 1, wherein a ratio of the first maximum height to a maximum height of the convex portion including the first and the second layers ranges from 0.1 to 0.4.

3. The semiconductor light emitting device of claim 1, wherein the first maximum height ranges from 240 nm to 380 nm.

4. The semiconductor light emitting device of claim 1, wherein the second material corresponds to a material having a refractive index smaller than that of the substrate.

5. The semiconductor light emitting device of claim 1, wherein the second layer comprises a plurality of materials, each of the plurality of materials having a refractive index smaller than that of the substrate.

6. The semiconductor light emitting device of claim 1, wherein a refractive index of the second layer ranges from 1 to 1.7.

7. The semiconductor light emitting device of claim 1, wherein the second layer is formed of $SiO_x$, $SiO_xN_y$, or $MgF_2$.

8. The semiconductor light emitting device of claim 1, wherein the second layer has a hemispherical or conic shape.

9. The semiconductor light emitting device of claim 1, wherein the convex portion comprises a plurality of protrusions, and
 wherein the plurality of protrusions are arranged in a lattice form.

10. The semiconductor light emitting device of claim 1, wherein in a vertical cross-sectional view, the first layer has a side surface extending from a lower surface of the second layer, the side surface of the first layer being inclined at a first angle with respect to an upper surface of the substrate and a side surface of a lower portion of the second layer being inclined at a second angle with respect to the upper surface of a substrate, and
 wherein the first angle is different from the second angle.

11. The semiconductor light emitting device of claim 1, wherein in a vertical cross-sectional view, the first layer has a side surface extending from a lower surface of the second layer, the side surface of the first layer being inclined at a first angle with respect to an upper surface of the substrate and a side surface of a lower portion of the second layer being inclined at a second angle with respect to the upper surface of a substrate, and
wherein the first angle is the same as the second angle.

12. The semiconductor light emitting device of claim 1, wherein the substrate surrounding the convex portion comprises a flat surface.

13. The semiconductor light emitting device of claim 1, wherein the substrate surrounding the convex portion comprises an uneven surface.

14. A semiconductor light emitting device comprising:
a substrate made of a first material;
a convex portion disposed on a surface of the substrate and comprising:
 a first layer made of the first material; and
 a second layer made of a second material different from the first material and disposed on the first layer; and
a light emitting stack comprising:
 a first conductivity-type semiconductor layer;
 an active layer; and
 a second conductivity-type semiconductor layer, the first conductivity-type semiconductor layer, the active layer and the second conductivity-type semiconductor layer sequentially disposed on the surface of the substrate on which the convex portion is disposed,
wherein a first maximum height of the first layer ranges from 240 nm to 380 nm and a second maximum height of the second layer is 1.5 to 9 times the first maximum height of the first layer, the first maximum height and the second maximum height being measured in a thickness direction of the semiconductor light emitting device, and
wherein the first maximum height of the first layer is measured from the surface of the substrate surrounding the convex portion.

15. The semiconductor light emitting device of claim 14, wherein the substrate comprises a sapphire substrate, and
wherein the light emitting stack is formed of a Group III nitride semiconductor.

16. The semiconductor light emitting device of claim 1, wherein the first layer comprises:
a first surface; and
a second surface opposite to the first surface along the thickness direction of the semiconductor light emitting device, the first surface provided closer to the substrate than the second surface, and
wherein the second layer is provided on the second surface of the first layer.

17. The semiconductor light emitting device of claim 14, wherein the first layer comprises:
a first surface; and
a second surface opposite to the first surface along the thickness direction of the semiconductor light emitting device, the first surface provided closer to the substrate than the second surface, and
wherein the second layer is provided on the second surface of the first layer.

18. The semiconductor light emitting device of claim 1, wherein the first surface is coplanar with the surface of the substrate surrounding the convex portion.

19. The semiconductor light emitting device of claim 14, wherein the first surface is coplanar with the surface of the substrate surrounding the convex portion.

* * * * *